United States Patent
Fukuda et al.

(10) Patent No.: US 11,767,612 B2
(45) Date of Patent: Sep. 26, 2023

(54) GROUP III NITRIDE SINGLE CRYSTAL SUBSTRATE

(71) Applicant: TOKUYAMA CORPORATION, Shunan (JP)

(72) Inventors: Masayuki Fukuda, Shunan (JP); Toru Nagashima, Shunan (JP)

(73) Assignee: TOKUYAMA CORPORATION, Shunan (JP)

( * ) Notice: Subject to any disclaimer, the term of this patent is extended or adjusted under 35 U.S.C. 154(b) by 245 days.

(21) Appl. No.: 16/649,382

(22) PCT Filed: Sep. 21, 2018

(86) PCT No.: PCT/JP2018/035204
§ 371 (c)(1),
(2) Date: Mar. 20, 2020

(87) PCT Pub. No.: WO2019/059381
PCT Pub. Date: Mar. 28, 2019

(65) Prior Publication Data
US 2020/0299862 A1    Sep. 24, 2020

(30) Foreign Application Priority Data
Sep. 22, 2017 (JP) .................. 2017-182967

(51) Int. Cl.
*C30B 29/40* (2006.01)
*C23C 16/02* (2006.01)
(Continued)

(52) U.S. Cl.
CPC ........ *C30B 29/403* (2013.01); *C23C 16/0209* (2013.01); *C23C 16/34* (2013.01);
(Continued)

(58) Field of Classification Search
CPC ... C23C 16/0209; C23C 16/34; C30B 25/186; C30B 25/20; C30B 29/403;
(Continued)

(56) References Cited

U.S. PATENT DOCUMENTS 8,778,783 B2 * 7/2014 Melnik ............ H01L 21/02304
438/504
9,074,297 B2 * 7/2015 Leibiger ............... C30B 29/403
(Continued)

FOREIGN PATENT DOCUMENTS

EP          3026693 A1    6/2016
EP          3193356 A1    7/2017
(Continued)

OTHER PUBLICATIONS

Kuball, "Raman spectroscopy of GaN, AlGaN and AlN for process and growth monitoring/control," Surface and Interface Analysis 31 (2001) pp. 987-999.*
(Continued)

*Primary Examiner* — Jay C Kim
(74) *Attorney, Agent, or Firm* — Birch, Stewart, Kolasch & Birch, LLP

(57) ABSTRACT

A group III nitride single crystal substrate including a main surface, the main surface including: a center; a periphery; an outer region whose distance from the center is greater than 30% of a first distance, the first distance being a distance from the center to the periphery; and an inner region whose distance from the center is no more than 30% of the first distance, wherein a ratio $(v_A - v_B)/v_B$ is within the range of ±0.1%, wherein $v_A$ is a minimum value of peak wave numbers of micro-Raman spectra in the inner region; and $v_B$ is an average value of peak wave numbers of micro-Raman spectra in the outer region.

4 Claims, 4 Drawing Sheets

(51) Int. Cl.
  *C23C 16/34* (2006.01)
  *C30B 25/18* (2006.01)
  *C30B 25/20* (2006.01)
  *H01L 21/02* (2006.01)
  *H01L 33/00* (2010.01)

(52) U.S. Cl.
  CPC ............ *C30B 25/186* (2013.01); *C30B 25/20* (2013.01); *H01L 21/0254* (2013.01); *H01L 21/0262* (2013.01); *H01L 21/02389* (2013.01); *H01L 21/02634* (2013.01); *H01L 21/02658* (2013.01); *H01L 33/0075* (2013.01)

(58) Field of Classification Search
  CPC ........... H01L 21/02389; H01L 21/0254; H01L 21/0262; H01L 21/02634; H01L 21/02658; H01L 33/0075
  See application file for complete search history.

(56) References Cited

U.S. PATENT DOCUMENTS

| | | | |
|---|---|---|---|
| 9,627,197 B2 * | 4/2017 | Chen | H01L 33/007 |
| 9,896,780 B2 * | 2/2018 | Furuya | H01L 21/0254 |
| 10,347,790 B2 * | 7/2019 | Ma | H01L 33/34 |
| 10,458,043 B2 * | 10/2019 | Kiyama | C30B 29/406 |
| 2005/0287774 A1 | 12/2005 | Shibata et al. | |
| 2008/0083970 A1 | 4/2008 | Kamber et al. | |
| 2010/0173483 A1 | 7/2010 | Ueno et al. | |
| 2012/0295418 A1 * | 11/2012 | Melnik | H01L 21/0262 257/E21.108 |
| 2014/0346638 A1 | 11/2014 | Koukitu et al. | |
| 2015/0247260 A1 | 9/2015 | Koukitu et al. | |
| 2016/0108554 A1 | 4/2016 | Kitsu et al. | |
| 2016/0143050 A1 | 5/2016 | Saiwai et al. | |
| 2017/0137966 A1 | 5/2017 | Kiyama et al. | |
| 2017/0330745 A1 | 11/2017 | Nagashima et al. | |

FOREIGN PATENT DOCUMENTS

| | | |
|---|---|---|
| JP | 2003-327497 A | 11/2003 |
| JP | 2006-332570 A | 12/2006 |
| JP | 2009-536605 A | 10/2009 |
| JP | 2015-12403 A | 1/2015 |
| JP | 2015-17030 A | 1/2015 |
| JP | 2015-44707 A | 3/2015 |
| JP | 2016-23123 A | 2/2016 |
| JP | 2016-216342 A | 12/2016 |
| JP | 6070297 B2 | 2/2017 |
| KR | 10-2014-0104438 A | 8/2014 |
| WO | WO 2013/094058 A1 | 6/2013 |
| WO | WO 2014/031119 A1 | 2/2014 |
| WO | WO 2016/076270 A1 | 5/2016 |

OTHER PUBLICATIONS

Kuball et al., "Raman scattering studies on single-crystalline bulk AlN under high pressures," Applied Physics Letters 78 (2001) pp. 724-726.*

Ramkumar et al., "Micro-Raman Scattering From Hexagonal GaN, AlN, and AlxGa1-xN Grown on (111) Oriented Silicon: Stress Mapping of Cracks," (2001).*

Zheng et al., "Raman tensor of AlN bulksingle crystal," Photonics Research 3 (2015) pp. 38-43.*

Hayes et al., "Temperature Dependence of the Phonons of Bulk AlN," Japanese Journal of Applied Physics 39 (2000) pp. L 710-L 712.*

Kazan et al., "Temperature dependence of Raman-active modes in AlN," Diamond & Related Materials 15 (2006) pp. 1169-1174.*

International Search Report (PCT/ISA/210) issued in PCT/JP2018/035204, dated Nov. 13, 2018.

* cited by examiner

GROUP III NITRIDE SINGLE CRYSTAL SUBSTRATE

TECHNICAL FIELD

The present invention relates to a high-quality group III nitride single crystal substrate having reduced crystal defects in the proximity of the center thereof, and a method for production thereof.

BACKGROUND

Group III nitride semiconductors such as aluminum nitride, gallium nitride, and indium nitride, are able to form mixed crystal semiconductors of freely-selected compositions, and are able to have various bandgap values depending on mixed crystal compositions thereof. Use of group III nitride single crystals thus allows production of light emitting devices of a wide range of emission wavelength ranging from infrared to ultraviolet wavelengths. Intensive efforts have been recently made to develop light emitting devices employing aluminum-based group III nitride semiconductors (mainly aluminum gallium nitride mixed crystal).

At present, sapphire substrates are commonly employed for production of group III nitride light emitting devices, in view of crystal quality, ultraviolet transparency, mass productivity, and cost. When a group III nitride is grown over a sapphire substrate, though, differences of e.g. lattice constants and thermal expansion coefficients between the sapphire substrate and the group III nitride (such as aluminum gallium nitride) which forms an epitaxial semiconductor film make the epitaxial layer suffer e.g. crystal defects (dislocation defects) and cracks, which may result in lower emission performance of the device. In view of improving device performance, it is desirable to employ a substrate which has lattice constants and thermal expansion coefficients close to those of the epitaxial semiconductor film. Thus, as a substrate for production of the aluminum-based group III nitride semiconductor light emitting devices, it is preferable to employ a group III nitride single crystal substrate such as aluminum nitride and aluminum gallium nitride.

Vapor phase growth methods, such as sublimation (PVT: Physical Vapor Transport), metalorganic vapor phase epitaxy (MOCVD: Metalorganic Chemical Vapor Deposition), and hydride vapor phase epitaxy (HVPE: Hydride Vapor Phase Epitaxy), are known as production methods of such group III nitride single crystal substrates. PVT is a method which sublimes a solid group III nitride at a high temperature and makes it deposit over a base substrate at a lower temperature. The PVT method is advantageous in that it can grow a thick film at a high growth rate. MOCVD and HVPE are methods which produce single crystals by reacting a group III source gas and a nitrogen source gas (such as ammonia gas) over a base substrate.

Vapor phase growth of a group III nitride single crystal substrate may suffer contamination of the inside or the surface of the substrate by an impurity element or a foreign material or may suffer their deposition onto the substrate surface. Impurities or foreign matters liberated from a reactor into an atmosphere, which derives from a reactor attacked by an atmosphere gas such as a group III source gas, as well as group III nitride particles formed during a reaction as by-products, are considered responsible to these problems.

In relation to impurities in aluminum nitride single crystals, Patent Literature 1 teaches a method for producing an aluminum nitride single crystal, the method including: (i) growing an aluminum nitride single crystal over a single crystal substrate by hydride vapor phase epitaxy by means of a HVPE apparatus, wherein the aluminum nitride single crystal has a carbon concentration of no less than $1 \times 10^{14}$ atoms/cm$^3$ and less than $3 \times 10^{17}$ atoms/cm$^3$, a chlorine concentration of $1 \times 10^{14}$ to $1 \times 10^{17}$ atoms/cm$^3$, and an absorption coefficient at a wavelength of 256 nm of no more than 40 cm$^{-1}$; the growing in the (i) is conducted at a temperature of 1200 to 1700° C.; the HVPE apparatus includes a first exposed surface arranged in a first region, the first region reaching no less than 1200° C. during the growing in the (i); the first exposed surface is composed of at least one specific member only; each of the at least one specific member consists of at least one first material or at least one second material, the first material not undergoing reductive decomposition or thermal decomposition at any temperature of 1200 to 1700° C., and the second material not liberating a gas containing a carbon atom even when the second material undergoes reductive decomposition or thermal decomposition.

In relation to silicon contamination and oxygen contamination of a crystal caused by a reaction of an aluminum monohalide gas and a quartz (SiO$_2$) wall member of a HVPE reactor, Patent Literature 3 teaches a method of growing an aluminum-containing group III nitride thin film by HVPE, the method including: (i) employing a corrosion-resistant material in a HVPE reactor, the corrosion resistant material being arranged in a first region, the first region contacting with an aluminum halide, and the HVPE reactor including a raw material zone; (ii) heating the raw material zone at a temperature equal to or greater than a predetermined temperature, the raw material zone including a raw material containing aluminum; and (iii) growing an aluminum-containing group III nitride thin film in the HVPE reactor.

In more recent years, there is demand for single crystals of higher quality. For example, in relation to an influence of an aluminum monohalide gas in an aluminum halide raw material gas, Patent Literature 4 teaches a method for producing an aluminum-based group III nitride single crystal, the method including: (i) supplying an aluminum halide gas and a nitrogen source gas onto a base substrate, such that the aluminum halide gas and the nitrogen source gas react over the base substrate, wherein the reaction of the aluminum halide gas and the nitrogen source gas is conducted under a condition that a halogen-based gas coexists such that a specific formula is satisfied, and wherein a growth rate of the aluminum-based group III nitride crystal is no less than 10 μM/h.

Patent Literature 5 teaches a method for producing an AlN single crystal layer of high transparency, the method including: (i) supplying an aluminum chloride gas from a first supply nozzle into a reactor, the reactor including a wall surface; (ii) supplying a nitrogen source gas from a second supply nozzle into the reactor; and (iii) making the aluminum chloride gas and the nitrogen source gas react with each other over a substrate arranged in the reactor, wherein an aluminum content in a deposit formed onto a flow channel wall surface during the reaction step is maintained to be no more than 30% on the basis of the total amount of aluminum supplied into the reactor; and the flow channel wall surface is maintained at a temperature of no more than 1200° C.; wherein the flow channel wall surface is defined as a wall surface within a range along a gas flow between 200 mm—upstream side of a tip of the first supply nozzle and 200 mm—downstream side of the tip of the first supply nozzle.

In relation to crystal defects observed as bright spots by X-ray reflection topography, Patent Literature 6 teaches a method for producing a group III nitride single crystal, the method including: (i) supplying a group III raw material gas and a nitrogen source gas onto a base substrate arranged in a reactor, such that the group III raw material gas and the nitrogen source gas react with each other over the base substrate, wherein at least one halogen-based gas selected from hydrogen halide gases and halogen gases is supplied onto the base substrate prior to supplying the group III raw material gas.

In relation to crystal defects observed as bright spots by X-ray reflection topography, Patent Literature 7 teaches an apparatus for production of a group III nitride single crystal including: a reactor including a reaction zone, wherein a group III raw material gas and a nitrogen source gas are reacted to grow a group III nitride crystal over a substrate; a susceptor arranged in the reaction zone, the susceptor supporting the substrate; a group III raw material supply nozzle supplying the group III raw material gas into the reaction zone; and a nitrogen source gas supply nozzle supplying the nitrogen source gas into the reaction zone, wherein the nitrogen source gas supply nozzle includes a structure such that the nitrogen source gas and at least one halogen-based gas selected from hydrogen halide gases and halogen gases into the reaction zone. Patent Literature 7 also teaches a method for producing a group III nitride single crystal, the method including: (a) supplying a group III raw material gas and a nitrogen source gas into the reaction zone of the apparatus for production of the group III nitride single crystal, such that the group III raw material gas and the nitrogen source gas react with each other, wherein in the (a), the nitrogen source gas and at least one halogen-based gas selected from hydrogen halide gases and halogen gases are supplied from the nitrogen source gas supply nozzle into the reaction zone.

CITATION LIST

Patent Literature

Patent Literature 1: WO 2013/094058 A1
Patent Literature 2: JP 6070297 B
Patent Literature 3: JP 2009-536605 A
Patent Literature 4: JP 2015-017030 A
Patent Literature 5: WO 2014/031119 A1
Patent Literature 6: JP 2016-216342 A
Patent Literature 7: WO 2016/076270 A1

SUMMARY

Technical Problem

Such measures have achieved, to some extent, suppression of side reactions and contamination of impurity elements and foreign matters in vapor phase growth methods, and thus have improved quality of group III nitride single crystals which can be produced. The inventors, though, have found that employment of such measures still fails to completely suppress occurrence of spots which are considered to be crystal defects on a group III nitride single crystal substrate. In more detail, such a crystal defect is observed as a relatively large protrusion (hereinafter may be referred to as "hillock") by Nomarski differential interference contrast microscopy, and is observed as a spot (hereinafter may be referred to as "bright spot") brighter than other area in X-ray reflection topography. The inventors have also found such a crystal defect exists in the proximity of the center of a substrate after crystal growth. The spot where such a crystal defect has occurred forms a pit (recess) during polishing treatment after growth. Electronic devices such as LEDs produced by depositing semiconductor layers over a group III nitride single crystal substrate which includes such a crystal defect may fail to achieve a desired performance or may suffer a leakage current path originating from the crystal defect. Thus, in view of obtaining electronic devices such as LEDs with higher yields, the number of such a crystal defect is desired to be as less as possible.

An object of the present invention is to provide a group III nitride single crystal substrate with suppressed occurrence of crystal defects in the proximity of the center of the substrate. A method for producing such a group III nitride single crystal substrate is also provided.

Solution to Problem

Analysis of such crystal defects formed in the proximity of the center of a group III nitride single crystal substrate by the present inventors revealed that a peak wave number of a micro Raman spectrum measured for a spot of such a crystal defect near the center of the substrate shifted from a theoretical value to the lower wave number side or to a higher wave number side, whereas a peak wave number of a micro Raman spectrum measured for a spot where a crystal defect was not formed was close to a theoretical value. Such a difference of peak wave numbers of micro Raman spectra between crystal defect parts and other regions is considered to derive from stress concentration in the crystal defect parts. While a group III nitride single crystal layer is grown over a base substrate and thereafter sliced off to give a group III nitride single crystal substrate, further investigation revealed that a peak wave number of a micro Raman spectrum measured for the base substrate shifted from a theoretical value to the lower wave number side, i.e. stress remained in the base substrate. The present inventors finally found that employing a base substrate having less residual stress offered suppression of formation of crystal defects in the proximity of the center of a crystal layer grown over the base substrate.

A first aspect of the present invention is a group III nitride single crystal substrate comprising a main surface, the main surface comprising: a center; a periphery; an outer region whose distance from the center is greater than 30% of a first distance, the first distance being a distance from the center to the periphery; and an inner region whose distance from the center is no more than 30% of the first distance, wherein a ratio $(v_A - v_B)/v_B$ is within the range of ±0.1%, wherein $v_A$ is a minimum value of peak wave numbers of micro-Raman spectra in the inner region; and $v_B$ is an average value of peak wave numbers of micro-Raman spectra in the outer region.

In the first aspect of the present invention, the ratio $(v_A - v_B)/v_B$ is preferably within the range of ±0.05%.

In the first aspect of the present invention, the group III nitride single crystal substrate is preferably an aluminum nitride single crystal substrate.

A second aspect of the present invention is a method for producing a group III nitride single crystal substrate, the method comprising, in the sequence set forth: (a) thermally treating a base substrate at a constant temperature of 1000 to 2300° C. for at least 60 seconds, wherein the base substrate is a group III nitride single crystal substrate comprising a main surface; and (b) growing a group III nitride single crystal layer over the main surface by means of vapor phase epitaxy, wherein the main surface has a surface roughness of no more than 0.5 run in terms of arithmetical mean height Sa.

In the second aspect of the present invention, the thermal treatment in the (a) is preferably carried out while supplying a halogen gas, a hydrogen halide gas, and/or ammonia gas.

In the second aspect of the present invention, the base substrate is preferably an aluminum nitride single crystal substrate, and the thermal treatment in the (a) is preferably carried out at the constant temperature of 1000 to 1700° C.

In the second aspect of the present invention, the vapor phase epitaxy in the (b) is preferably hydride vapor phase epitaxy.

Advantageous Effects of Invention

In the group III nitride single crystal substrate according to the first aspect of the present invention, the difference between the inner region and the outer region in peak wave numbers of micro Raman spectra is small. As noted above, variation of peak wave numbers of micro Raman spectra depending on positions in a single crystal substrate means that there is residual stress in the single crystal substrate. The group III nitride single crystal substrate of the present invention has a reduced number of crystal defects which are considered to derive from residual stress in the proximity of the center of the substrate, and thus has a higher uniformity over the entire face of the single crystal substrate. Thus the first aspect of the present invention can provide a group III nitride single crystal substrate with suppressed occurrence of crystal defects in the proximity of the center of the substrate.

The method for producing the group III nitride single crystal substrate according to the second aspect of the present invention makes it possible to produce the group III nitride single crystal substrate according to the first aspect of the present invention.

DESCRIPTION OF EMBODIMENTS

Figure 1:
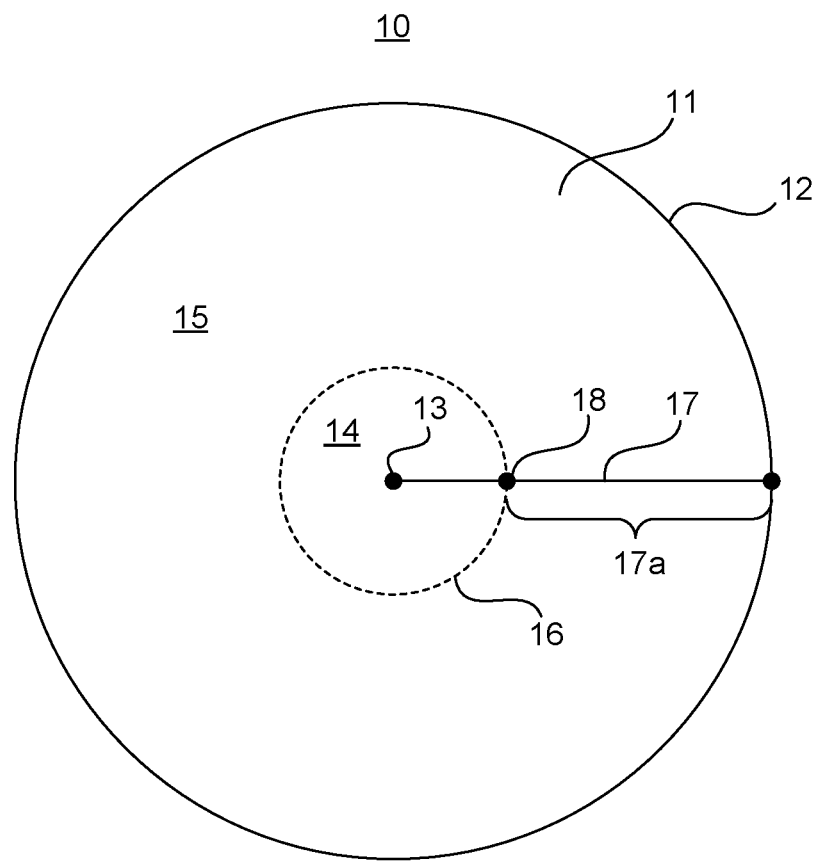
FIG. 1 is a plan view of a group III nitride single crystal substrate 10 according to one embodiment to explain an inner region and an outer region in a case where a main surface of a substrate has a circular shape.

Hereinafter the embodiments of the present invention will be described in more detail with reference to the drawings. The present invention is not limited to these embodiments. The measures in the drawings do not always represent exact measures. Some reference signs may be omitted in the drawings. In the present description, an expression "A to B" concerning numeral values A and B means "no less than A and no more than B" unless otherwise specified. If a unit is added only to the numeral value B in such an expression, the same unit is applied to the numeral value A as well. A word "or" means a logical sum unless otherwise specified. An expression "$E_1$ and/or $E_2$" concerning elements $E_1$ and $E_2$ means "$E_1$ or $E_2$ or any combination thereof", and an expression "$E_1, \ldots, E_{N-1}$, and/or $E_N$" (N is an integer of 3 or more) means "$E_1, \ldots, E_{N-1}$, or $E_N$, or any combination thereof".

<1. Group III Nitride Single Crystal Substrate>

The group III nitride single crystal substrate according to the first aspect of the present invention comprises a main surface, and the main surface comprises: a center; a periphery; art outer region whose distance from the center is greater than 30% of a first distance, the first distance being a distance from the center to the periphery; and an inner region whose distance from the center is no more than 30% of the first distance, wherein a ratio $(v_A-v_B)/v_B$ (hereinafter may be referred to as "wave number deviation ratio") is within the range of ±0.1%, wherein $v_A$ is a minimum value of peak wave numbers of micro-Raman spectra in the inner region; and $v_B$ is an average value of peak wave numbers of micro-Raman spectra in the outer region. A spot which shows a shifted peak wave number in the micro Raman spectrum is a crystal defect which is observed as a relatively large hillock in Nomarski differential interference contrast microscopy, and is observed as a bright spot in X-ray reflection topography. Such a spot of a crystal defect tends to form a pit (recess) when the single crystal substrate is subjected to polishing treatment. The group III nitride single crystal substrate of the present invention offers suppression of occurrence of such a crystal defect, which offers suppression of pit formation in polishing treatment. It is thus possible to uniformly grow a group III nitride semiconductor layer over the substrate, which makes it possible to fabricate electronic devices such as LEDs over the substrate at a higher yield.

Since a shifted peak wave number in a micro Raman spectrum suggests stress concentration, mechanical strength of a substrate in a spot of such a shifted peak wave number is considered lower than in other portions. The group III nitride single crystal substrate offers suppression of stress concentration in the proximity of the center of the substrate, which is considered to offer improved uniformity of mechanical strength.

When a group III nitride single crystal substrate has a main surface having a rotationally symmetric shape, the center of the main surface shall be the position of the axis of the rotational symmetry. Examples of rotationally symmetric shape include circle and regular polygons (such as regular hexagon). In one embodiment, a group III nitride single crystal substrate has a main surface having a circular shape, a regular polygonal shape, a partly-distorted circular shape, or a partly-distorted polygonal shape. Examples of partly-distorted circular or polygonal shapes include circular shapes and polygonal shapes which are partly cut out. Examples of a cutout of the main surface (i.e. a cutout provided in a substrate) include an orientation flat.

When the main surface has a partly-distorted circular shape and thus does not have rotational symmetry, the center of the main surface shall be the center of the original circle. The original circle can be found as the circle whose periphery has the longest total overlap with the periphery of the main surface. The center of the original circle also can be found as the intersection of two longest straight lines which can be drawn from the periphery of the main surface to the opposite periphery of the main surface.

When the main surface has a partly-distorted regular polygonal shape and thus does not have rotational symmetry, the center of the main surface shall be the center of the original regular polygon. The original regular polygon can be found as the regular polygon whose periphery has the longest total overlap with the periphery of the main surface. Such an original regular polygon can be obtained by deformation of the shape of the main surface such that change of the area of the shape is minimized.

In the main surface, the boundary between the inner region and the outer region is a trace drawn by a point such that a distance from the center to the point is 30% of the distance from the center to the periphery: i.e. a trace drawn by a point when a line segment connecting the center and the periphery is rotated by a single rotation around the center wherein the point divides the line segment internally into a ratio of (distance from the center):(distance from the periphery)=3:7. For an example, if the main surface is a circular shape, the boundary between the inner region and the outer region in the main surface is a concentric circle whose radius is 30% of the radius of the main surface. For another example, if the main surface is a regular polygonal shape (such as regular hexagon), the boundary between the inner region and the outer region is a regular polygon which is similar to the main surface and shares its center with the main surface, wherein the homothetic ratio of the inner region (the regular polygon which forms the boundary) and the main surface (the periphery) is (the inner region):(the main surface)=3:10.

The ratio of the difference between the minimum value of peak wave numbers of micro-Raman spectra in the inner region ($v_A$) and the average value of peak wave numbers of micro-Raman spectra in the outer region ($v_B$) to the average value of peak wave numbers of micro-Raman spectra in the outer region ($v_B$) is calculated by the following formula.

$$100\times(v_A-v_B)/v_B(\%)$$

Any peak wave number of micro-Raman spectra used in calculation of the above formula shall be a wave number of a peak corresponding to the same mode. In the above formula, the minimum value of peak wave numbers of micro-Raman spectra in the inner region ($v_A$) is the minimum value of peak wave numbers of micro-Raman spectra measured for a plurality of spots in the inner region. Measurement spots of micro-Raman spectra in the inner region are selected as in the following. The main surface of the group III nitride single crystal substrate is observed by X-ray reflection topography. When one or more crystal defect(s) is/are observed in the X-ray reflection topography image, micro-Raman spectra are measured for at least 3 spots in the inner region, the at least 3 spots including all of the crystal defect(s). When no crystal defect is observed in the X-ray reflection topography image, micro-Raman spectra are measured for the center of the main surface and at least 2 spots randomly selected from the inner region (i.e. at least 3 spots in total). It is noted that the X-ray reflection topography image can be preferably obtained by detecting CuKα1 ray diffracted by (114) plane of the substrate. Currently commercially available Cu-target X-ray tubes can be used as X-ray sources having sufficiently high X-ray intensities for X-ray reflection topography measurements of the main surface. In X-ray reflection topography images measured with (114) plane as the diffraction plane, crystal defects are observed as bright spots. When the main surface of the substrate is c-face or –c-face, (114) plane can be preferably used as the diffraction plane for the X-ray reflection topography observation. When the main surface of the substrate is a-face or m-face, (114) plane may be used as the diffraction plane for the X-ray reflection topography observation, or (105) plane or (214) plane may be used as the diffraction plane for the X-ray reflection topography observation. Although crystal defects are observed as dark or bright spots in X-ray reflection topography images measured with (105) plane or (214) plane as the diffraction plane, positions of the dark or bright spots observed in X-ray reflection topography images measured with (105) plane or (214) plane as the diffraction plane are the same as positions of bright spots observed in X-ray reflection topography images measured with (114) plane as the diffraction plane. The average value of peak wave numbers of micro-Raman spectra in the outer region ($v_B$) is an average value of peak wave numbers of micro-Raman spectra measured for a plurality of spots in the outer region. Measurement spots of micro-Raman spectra in the outer region are at least 3 spots arranged at regular intervals along the entire length of a part of a line segment, the line segment connecting the center of the main surface and the periphery, and the part being included in the outer region. The interval between the measurement spots in the outer region is preferably no more than 2 mm, and for example it may be 2 mm. The line segment connecting the center of the main surface and the periphery (i.e. the line segment along which the measurement spots in the outer region is arranged) is randomly selected within the limit that a crack, a foreign matter, or deviation of crystal orientation is not on the line segment in the outer region.

FIG. 1 is a plan view of a group III nitride single crystal substrate 10 (hereinafter may be referred to as "substrate 10") according to one embodiment to explain an inner region and an outer region in a case where a main surface of a substrate has a circular shape. The substrate 10 comprises a main surface 11, and the main surface 11 comprises a periphery 12. The substrate 10 is a substrate having a circular shape, and the shape of the main surface 11 is circle. Since the shape of the main surface 11 has rotational symmetry, the position of the center 13 of the main surface 11 is the position of the axis of the rotational symmetry. In the main surface 11, the boundary 16 between an inner region 14 and an outer region 15 is a trace drawn by a point 18 such that a distance from the center 13 to the point 18 is 30% of the distance from the center 13 to the periphery 12: i.e. a trace drawn by the point 18 when a line segment 17 connecting the center 13 and the periphery 12 is rotated by a single rotation around the center 13 wherein the point 18 divides the line segment 17 internally into a ratio of (distance from the center 13):(distance from the periphery 12)=3:7. Since the main surface 11 has a circular shape, the boundary 16 between the inner region 14 and the outer region 15 in the main surface 11 is a concentric circle whose radius is 30% of the radius of the main surface 11. Measurement spots of micro-Raman spectra in the outer region 15 are arranged at regular intervals over the entire length of a part 17a of the line segment 17, wherein the line segment 17 connects the center 13 of the main surface 11 and the periphery 12, and wherein the part 17a is a part contained in the outer region 15.

Figure 2:
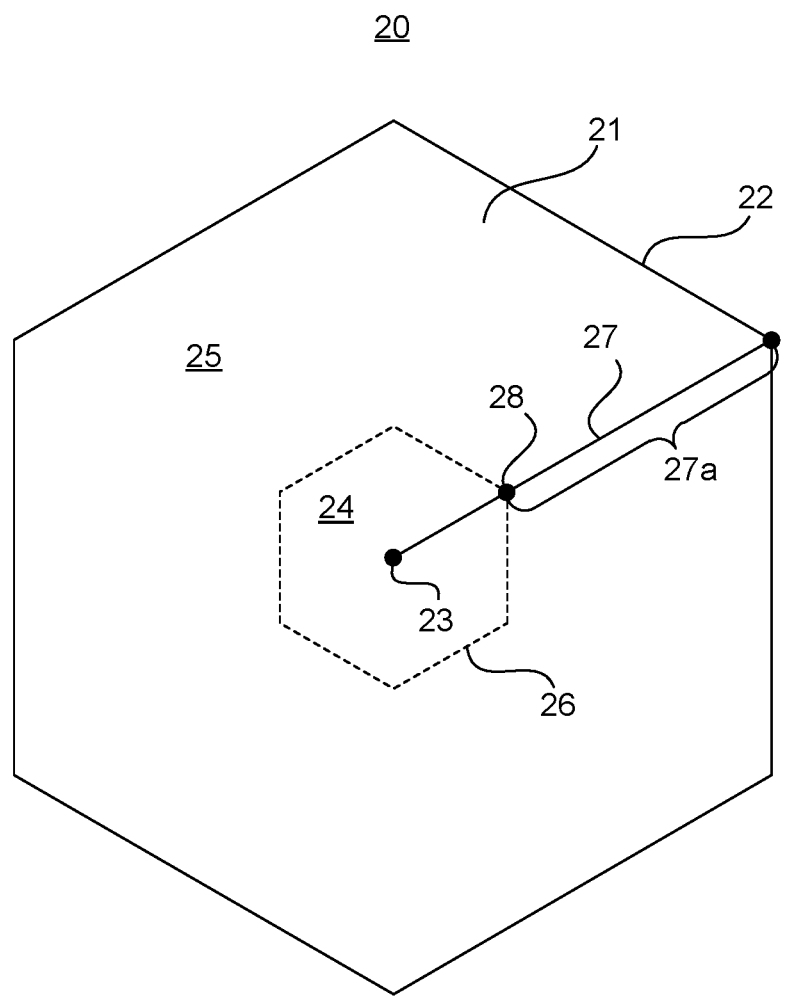
FIG. 2 is a plan view of a group III nitride single crystal substrate 20 according to one embodiment to explain an inner region and an outer region in a case where a main surface of a substrate has a regular polygonal shape.

FIG. 2 is a plan view of a group III nitride single crystal substrate 20 (hereinafter may be referred to as "substrate 20") according to one embodiment to explain an inner region and an outer region in a case where a main surface of a substrate has a regular polygonal shape. The substrate 20 comprises a main surface 21, and the main surface 21 comprises a periphery 22. The substrate 20 is a substrate having a regular hexagonal shape, and the shape of the main surface 21 is regular hexagon. Since the shape of the main surface 21 has rotational symmetry, the position of the center 23 of the main surface 21 is the position of the axis of the rotational symmetry. In the main surface 21, the boundary 26 between an inner region 24 and an outer region 25 is a trace drawn by a point 28 such that a distance from the center 23 to the point 28 is 30% of the distance from the center 23 to the periphery 22: i.e. a trace drawn by the point 28 when a line segment 27 connecting the center 23 and the periphery 22 is rotated by a single rotation around the center 23 wherein the point 28 divides the line segment 27 internally into a ratio of (distance from the center 23):(distance from the periphery 22)=3:7. Since the main surface 21 has a regular hexagonal shape, the boundary 26 between the inner region 24 and the outer region 25 in the main surface 21 is a regular hexagon which is similar to the main surface 21 and shares its center 23 with the main surface 21, wherein the homothetic ratio is (the inner region 24):(the main surface 21)=(the boundary 26):(the periphery 22)=3:10. Measurement spots of micro-Raman spectra in the outer region 25 are arranged at regular intervals over the entire length of a part 27a of the line segment 27, wherein the line segment 27 connects the center 23 of the main surface 21 and the periphery 22, and wherein the part 27a is a part contained in the outer region 25.

Figure 3:
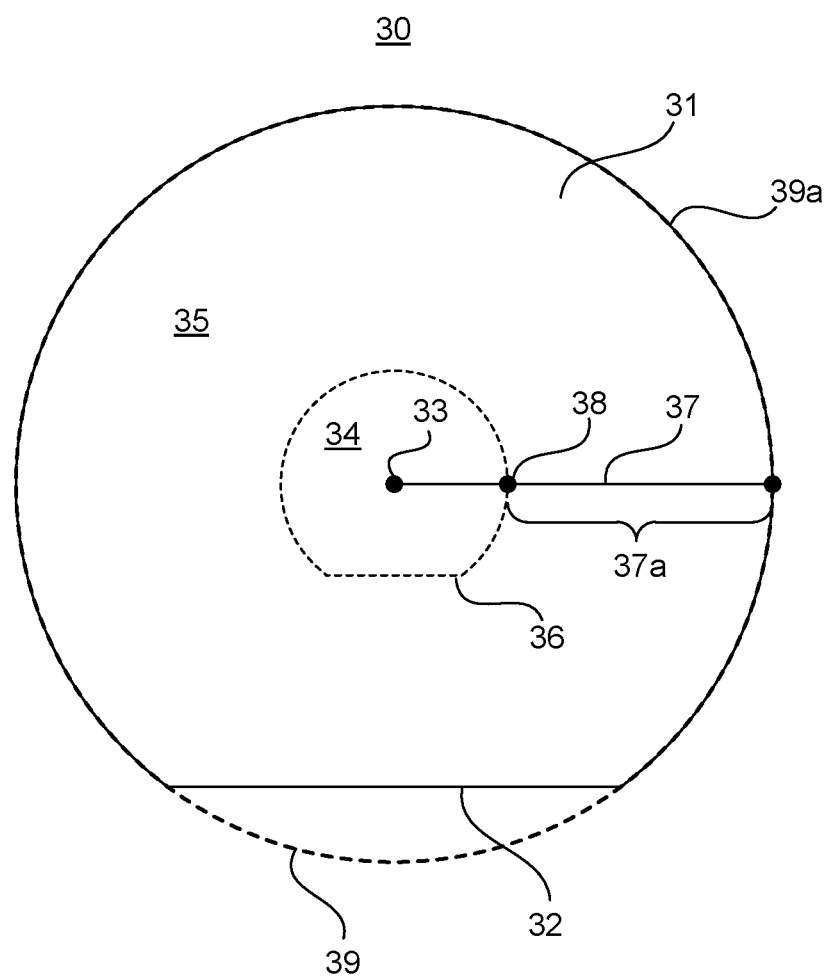
FIG. 3 is a plan view a group III nitride single crystal substrate 30 according to one embodiment to explain an inner region and an outer region in a case where a main surface of a substrate has a partly-distorted circular shape.

FIG. 3 is a plan view a group III nitride single crystal substrate 30 (hereinafter may be referred to as "substrate 30") according to one embodiment to explain an inner region and an outer region in a case where a main surface of a substrate has a partly-distorted circular shape. The substrate 30 comprises a main surface 31, and the main surface 31 comprises a periphery 32. The substrate 30 is a circular substrate having an orientation flat, that is, the substrate 30 is a substrate having a circular shape which is partly cut out, and the shape of the main surface 31 is a partly-distorted circle. Since the shape of the main surface 31 is partly distorted from circle, it does not have rotational symmetry. The "original circle" 39 can be found as the circle 39 whose periphery has the longest (total) overlap 39a with the periphery 32 of the main surface 31. The center of the main surface 31 is the center 33 of the original circle 39. In the main surface 31, the boundary 36 between an inner region 34 and an outer region 35 is a trace drawn by a point 38 such that a distance from the center 33 to the point 38 is 30% of the distance from the center 33 to the periphery 32: i.e. a trace drawn by the point 38 when a line segment 37 connecting the center 33 and the periphery 32 is rotated by a single rotation around the center 33 wherein the point 38 divides the line segment 37 internally into a ratio of (distance from the center 33):(distance from the periphery 32)=3:7. The shape of the boundary 36 is similar to the shape of the main surface 31, wherein the homothetic ratio is (the inner region 34):(the main surface 31)=(the boundary 36):(the periphery 32)=3:10. Measurement spots of micro-Raman spectra in the outer region 35 are arranged at regular intervals over the entire length of a part 37a of the line segment 37, wherein the line segment 37 connects the center 33 of the main surface 31 and the periphery 32, and wherein the part 37a is a part contained in the outer region 35.

Figure 4:
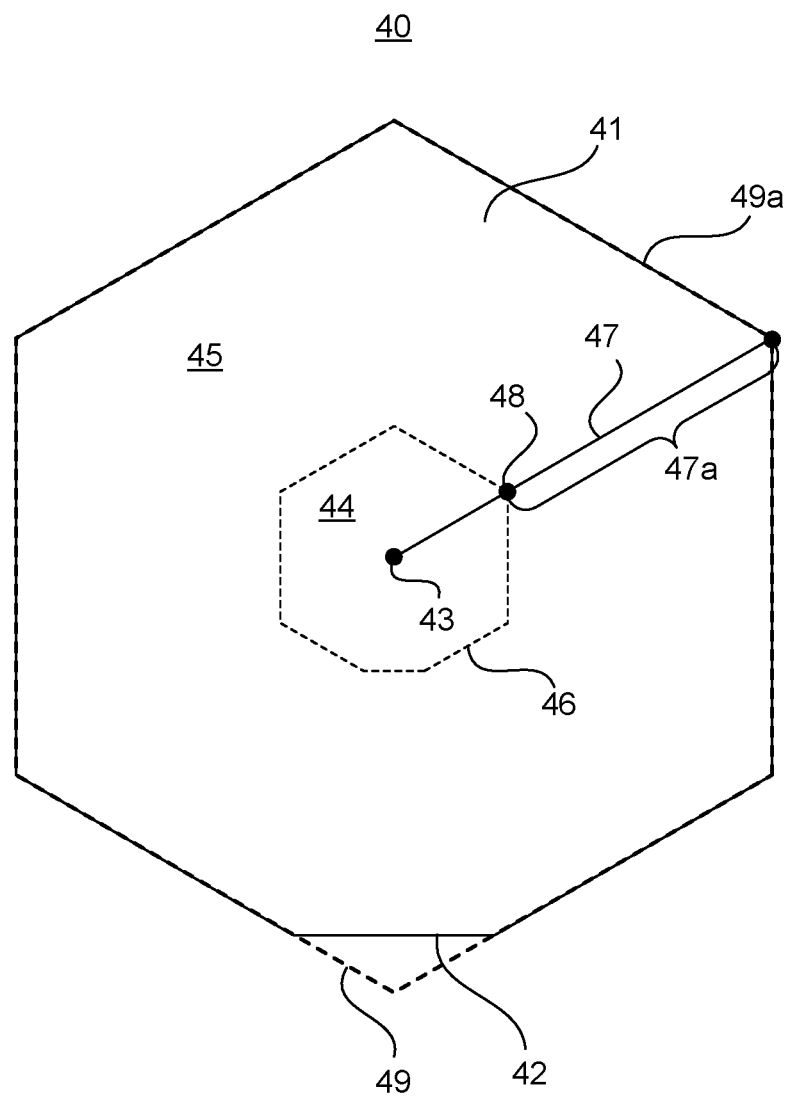
FIG. 4 is a plan view of a group III nitride single crystal substrate 40 according to one embodiment to explain an inner region and an outer region in a case where a main surface of a substrate has a partly-distorted regular polygonal shape.

FIG. 4 is a plan view of a group III nitride single crystal substrate 40 (hereinafter may be referred to as "substrate 40") according to one embodiment to explain an inner region and an outer region in a case where a main surface of a substrate has a partly-distorted regular polygonal shape. The substrate 40 comprises a main surface 41, and the main surface 41 comprises a periphery 42. The substrate 40 is a regular hexagonal substrate having an orientation flat, that is, the substrate 40 is a substrate having a regular hexagonal shape which is partly cut out, and the shape of the main surface 41 is a partly-distorted regular hexagon. Since the shape of the main surface 41 is partly distorted from regular hexagon, it does not have rotational symmetry. The "original regular hexagon" 49 can be found as the regular hexagon 49 whose periphery has the longest (total) overlap 49a with the periphery 42 of the main surface 41. The center of the main surface 41 is the center 43 of the original regular hexagon 49. In the main surface 41, the boundary 46 between an inner region 44 and an outer region 45 is a trace drawn by a point 48 such that a distance from the center 43 to the point 48 is 30% of the distance from the center 43 to the periphery 42: i.e. a trace drawn by the point 38 when a line segment 47 connecting the center 43 and the periphery 42 is rotated by a single rotation around the center 43 wherein the point 48 divides the line segment 47 internally into a ratio of (distance from the center 43):(distance from the periphery 42)=3:7. The shape of the boundary 46 is similar to the shape of the main surface 41, wherein the homothetic ratio is (the inner region 44):(the main surface 41)=(the boundary 46):(the periphery 42)=3:10. Measurement spots of micro-Raman spectra in the outer region 45 are arranged at regular intervals over the entire length of a part 47a of the line segment 47, wherein the line segment 47 connects the center 43 of the main surface 41 and the periphery 42, and wherein the part 47a is a part contained in the outer region 45.

Smaller "wave number deviation ratio" in the group III nitride single crystal substrate means that the substrate has less crystal defect(s) and is more uniform substrate. The "wave number deviation ratio" is preferably within the range of ±0.05%, more preferably within the range of ±0.03%.

Wave numbers of micro-Raman spectra can be evaluated by means of a micro-Raman spectrometer. In more detail, a laser of 531.98 nm in wavelength is employed as an excitation laser; slit width and a grating are adjusted such that wave number resolution of no more than 0.5 cm$^{-1}$ is obtained; excitation laser power is adjusted to be about 10 mW; and the excitation layer is irradiated to the main surface of a group III nitride single crystal substrate, through an objective lens of 100 times magnification such that the diameter of an measurement spot becomes about 1 μm, to measure a local Raman spectrum. Calibration of measured Raman spectra are carried out by means of, for an example, a wave number of 521.448 cm$^{-1}$ which is a representative Raman shift of silicon substrates, or the wave number of the excitation laser. The peak to be subjected to wave number evaluation in a Raman spectrum of a group III nitride single crystal may be any peak as long as the peak can be observed. In Raman spectra of wurtzite group III nitrides, peaks corresponding to respective modes of $A_1(TO)$, $A_1(LO)$, $E_1(TO)$, $E_1(LO)$, $E_2^{high}$, and $E_2^{low}$ can be observed. Such a peak that corresponds to a lattice vibration mode whose Raman shift wave number changes depending on stress in the in-plane direction of the main surface of a group III nitride single crystal substrate is preferably employed for evaluation. As such a peak, the $E_2^{high}$ peak may be preferably employed. The $E_2^{high}$ peak can be observed by irradiating the excitation laser onto the main surface, irrespective of the face orientation of the growth face (the main surface) of the group III nitride single crystal substrate. Further, the wave number of the $E_2^{high}$ peak changes depending on stress in the in-plane direction of the main surface of the group III nitride single crystal substrate, irrespective of the face orientation of the main surface. The $E_2^{high}$ peak of gallium nitride is observed at 567.6 cm$^{-1}$, and the $E_2^{high}$ peak of aluminum nitride is observed at 657.4 cm$^{-1}$.

The group III nitride which constitutes the group III nitride single crystal substrate is not particularly limited. Examples of the group III nitride single crystal substrate include an AlN substrate, a GaN substrate, an AlGaN substrate, an InGaN substrate, and an InAlGaN substrate. Among them, the AlN substrate and the GaN substrate are preferable in view of better lattice-matching when a group III nitride semiconductor light emitting device layer is grown over the substrate and in view of higher transparency of light of 210 to 365 nm in wavelength which is deep ultraviolet region.

The diameter and the thickness of the group III nitride single crystal substrate is not particularly limited, and may be suitably determined depending on desired use. The group III nitride single crystal substrate of the present invention can have a large diameter, because the substrate has small residual stress therein. When the group III nitride single crystal substate of the present invention is used as a substrate for fabricating a group III nitride semiconductor light emitting device, the diameter and the thickness of the substrate may be suitably determined, the diameter being preferably 10 to 210 mm, especially preferably 20 to 210 mm, and the thickness being preferably 50 to 2000 µm, especially preferably 100 to 1000 µm.

The face orientation of the growth face (the main surface) of the group III nitride single crystal substrate is not particularly limited, as long as the group III nitride single crystal can grow with the face orientation as the growth face orientation. Examples of the face orientation of the growth face (the main surface) of the group III nitride single crystal substrate include+c-face, −c-face, m-face, a-face, and r-face.

Smaller half width of an X-ray rocking curve measured for a group III nitride single crystal substrate means better crystal quality of the substrate. When the growth face (the main surface) of the group III nitride single crystal substrate is c-face or −c-face, the half width of the X-ray rocking curve measured for (0002) diffraction plane is preferably no more than 100 arcsec, and especially preferably no more than 50 arcsec. When the growth face (the main surface) of the group III nitride single crystal substrate is a-face, the half width of the X-ray rocking curve measured for (11-20) diffraction plane is preferably no more than 100 arcsec, and especially preferably no more than 50 arcsec. When the growth face (the main surface) of the group III nitride single crystal substrate is m-face, the half width of the X-ray rocking curve measured for (10-10) diffraction plane is preferably no more than 100 arcsec, and especially preferably no more than 50 arcsec.

Lower impurity concentrations in the group III nitride single crystal substrate is preferred because they have influence on light transmissivity in the ultraviolet region. In more detail, the group III nitride single crystal substrate preferably has a silicon concentration of $1 \times 10^{15}$ to $1 \times 10^{19}$ cm$^{-3}$, an oxygen concentration of $1 \times 10^{15}$ to $2 \times 10^{19}$ cm$^{-3}$, and a carbon concentration of $1 \times 10^{14}$ to $5 \times 10^{17}$ cm$^{-3}$; more preferably has a silicon concentration of $2 \times 10^{75}$ to $5 \times 10^{18}$ cm$^{-3}$, an oxygen concentration of $2 \times 10^{15}$ to $1 \times 10^{19}$ cm$^{-3}$, and a carbon concentration of $2 \times 10^{14}$ to $3 \times 10^{17}$ cm$^{-3}$; and especially preferably has a silicon concentration of $3 \times 10^{15}$ to $2 \times 10^{18}$ cm$^{-3}$, an oxygen concentration of $3 \times 10^{15}$ to $2 \times 10^{18}$ cm$^{-3}$, and a carbon concentration of $3 \times 10^{14}$ to $1 \times 10^{17}$ cm$^{-3}$.

Since the group III nitride single crystal substrate does not form a pit (recess) when the substrate is subjected to polishing treatment, a group III nitride semiconductor light emitting device layer can be uniformly grown over the single crystal substrate. Thus, when the light emitting device layer is formed to produce a wafer and thereafter the wafer is cut to give light emitting diodes, the yield of the light emitting diode can be improved. The group III nitride single crystal substrate is also considered to have improved workability when making the wafer into chips, since distortion which accompanies crystal defects is reduced or eliminated in the substate.

Such a group III nitride single crystal substrate of the present invention can be produced by the method for producing a group III nitride single crystal substrate of the present invention described later. In the following, the method for producing a group III nitride single crystal substrate of the present invention will be described in detail.

<2. Method for Producing Group III Nitride Single Crystal Substrate>

The method for producing a group III nitride single crystal substrate of the present invention comprises, in the sequence set forth: (a) thermally treating a base substrate at a constant temperature of 1000 to 2300° C. for at least 60 seconds, wherein the base substrate is a group III nitride single crystal substrate comprising a main surface; and (b) growing a group III nitride single crystal layer over the main surface by means of vapor phase epitaxy, wherein the main surface has a surface roughness of no more than 0.5 nm in terms of arithmetical mean height Sa.

Although the reason why a high-quality group III nitride single crystal substrate with reduced occurrence of crystal defect(s) in the proximity of the center of the substrate is not clear in detail, the inventors presume as in the following. As described above, crystal defects which occurs in the proximity of the center of a group III nitride single crystal substrate show peak wave numbers shifted to lower wave number side in micro-Raman spectra compared to other area, which is presumed to indicate existence of residual stress in the single crystal substrate. It is presumed that a base substrate used for production of a group III nitride singe crystal substrate has distortion remaining therein, and residual stress in the base substrate changes when a group III nitride single crystal layer is grown over the base substrate depending on growth conditions and a thermal history, which results in formation of a spot where stress is concentrated in the proximity of the center of the base substrate. When a single crystal layer is grown over such a base substrate, it is presumed that stress concentration also occurs in the position of the layer grown over the spot, which results in occurrence of a crystal defect. Peak wave numbers of a micro-Raman spectrum of the grown single crystal layer shift in the position where stress is concentrated. Residual stress in a base substrate thus changes depending on growth conditions and a thermal history. It is presumed that thermally treating a base substrate for at least 60 seconds at a constant temperature of 1000 to 2300° C. prior to growing a single crystal layer thereon makes relaxation of the residual stress in the base substrate occur, which makes it possible to produce the high-quality group III nitride single crystal substrate with reduced occurrence of crystal defect(s) in the proximity of the center of the substrate.

Patent Literature 6 teaches carrying out thermal cleaning prior to growing a group III nitride single crystal over a base substrate: in more detail, Patent Literature 6 teaches, when the base substrate is an aluminum nitride substrate or a sapphire substrate, carrying out thermal cleaning to remove organic materials attached on the base substrate by maintaining the base substrate at a temperature of no less than 1000° C. and no more than a growth temperature of the group III nitride single crystal for about 10 minutes while supplying a carrier gas containing hydrogen, and then growing the crystal. It is noted, however, such a method cannot suppress occurrence of crystal defects in the proximity of the center of the single crystal layer. The reason thereof is considered as in the following. When the temperature of the thermal cleaning is high, in a gas atmosphere such that a base substrate easily decomposes, decomposition of the base substrate occurs in the position where stress remains, or the growth surface of the base substrate is roughened, which causes surface roughening or abnormal growth during growth of the group III nitride single crystal layer, which results in occurrence of crystal defects during growth of the single crystal layer. When thermal cleaning conditions are mild (the treatment temperature is low, or the treatment time is short), stress relaxation cannot occur, and thus the cause of occurrence of crystal defects in the proximity of the center cannot be removed, which results in occurrence of crystal defects during growth of the single crystal layer. Even if residual stress in the base substrate could relax during the thermal cleaning treatment, the surface profile of the growth face (the main surface) of the base substrate may change accompanying stress relaxation, and thus flatness of the growth face is lost accompanying stress relaxation even if the growth face is flat enough before the thermal cleaning, and then the single crystal layer is grown over the growth face whose flatness is lost, which results in occurrence of crystal defects during growth of the single crystal layer.

In contrast, in the production method of the present invention, (a) a base substrate is thermally treated at a constant temperature of 1000 to 2300° C. for at least 60 seconds, and thereafter (b) under such a condition that the main surface of the base substrate has sufficiently high flatness (the surface profile is no more than 0.5 nm in terms of arithmetical mean height Sa), a group III nitride single crystal layer is grown over the main surface of the base substrate, which allows uniform crystal growth, which makes it possible to produce a high-quality group III nitride single crystal substrate with reduced occurrence of crystal defect(s) in the proximity of the center of thereof.

<2.1 Base Substrate>

The material of the base substrate is preferably the same kind of material as the group III nitride single crystal layer to be grown over the base substrate. Examples of such a base substrate include group III nitride single crystal substrates such as an AlN substrate, a GaN substrate, and an AlGaN substrate. When an aluminum nitride single crystal substrate is produced as the group III nitride singe crystal substrate, an aluminum nitride single crystal substrate is preferably employed as the base substrate, in view of growing an uniform and thick aluminum nitride single crystal layer. Aluminum nitride single crystal substrates produced by known methods such as PVT method and HVPE method may be employed as the aluminum nitride single crystal substrate. The base substrate preferably has a small number of defects (e.g. having a dislocation density of no more than $10^6$ cm$^{-2}$) and a thickness of 100 to 1000 μm, and preferably has a high flatness of the crystal growth surface (the main surface): i.e. a surface roughness of the crystal growth surface (the main surface) of no more than 0.5 nm, more preferably no more than 0.3 nm, and further preferably 0.2 nm, in terms of arithmetical mean height (Sa) (ISO 25178). The crystal growth surface (the main surface) of the base substrate may be polished such that the surface roughness of the crystal growth surface (the main surface) becomes no more than the upper limit if necessary. In the present description, the surface roughness (arithmetical mean height Sa) of the main surface of the base substrate is a value calculated based on results of observation of a square-shaped field of 2 μm in length×2 μm in width arranged in the center of the main surface by means of atomic force microscopy (AFM).

The diameter of the base substrate is not particularly limited, and may be suitably determined depending on desired use. For example, the diameter may be suitably determined within the range of 10 to 210 mm. The face orientation of the base substrate is not particularly limited, and may be suitably determined depending on the face orientation of the group III nitride single crystal layer to be grown. Examples of the face orientation of the main surface of the base substrate include +c-face, −c-face, m-face, a-face, and r-face.

Impurity concentrations of the base substrate considerably vary depending on the kind of the substrate and the production method of the substrate. Impurity concentrations of the base substrate may be suitably determined depending on desired use. When the base substrate is an aluminum nitride substrate, impurity concentrations thereof are: preferably $1\times10^{15}$ to $2\times10^{19}$ cm$^{-3}$ in silicon concentration, $1\times10^{15}$ to $5\times10^{19}$ cm$^{-3}$ in oxygen concentration, and $1\times10^{14}$ to $5\times10^{19}$ cm$^{-3}$ in carbon concentration; and especially preferably $2\times10^{15}$ to $1\times10^{19}$ cm$^{-3}$ in silicon concentration, $2\times10^{15}$ to $2\times10^{19}$ cm$^{-3}$ in oxygen concentration, and $2\times10^{16}$ to $1\times10^{19}$ cm$^{-3}$ in carbon concentration. As long as impurity concentrations are within the above range, stress strong enough to cause crystal defects does not occur between the base substrate and the group III nitride single crystal layer during growth, and thus defects are not formed in the central part of the substrate, even when there are differences between impurity concentrations of the base substrate and impurity concentrations of the group III nitride single crystal layer grown on the base substrate. A ratio of the total concentration of silicon, oxygen, and carbon, which are major impurities in the group III nitride single crystal layer, in the group III nitride single crystal layer, to the total concentration of silicon, oxygen, and carbon, which are major impurities in the base substrate, in the base substrate is preferably 0.001 to 100, more preferably 0.005 to 20, and further preferably 0.01 to 5 (single crystal layer/base substrate). The ratio of total impurity concentrations within the above range makes it possible to suppress formation of cracks in the group III nitride single crystal layer due to stress originated from differences in impurity concentrations between the group III nitride single crystal and the base substrate. The ratio of the total impurity concentrations of the group III nitride single crystal layer and the base substrate being closer to 1, i.e. smaller concentration difference, reduces a risk of crystal defect formation in the proximity of the center; but the method of the present invention offers reduced crystal defect formation in the proximity of the center even when there is a considerable difference in impurity concentrations between the group III nitride single crystal layer and the base substrate, which means greater possibility for stress originated from the impurity concentration difference to occur.

The production method of the present invention comprises thermally treating the base substrate for at least 60 seconds at a constant temperature of 1000 to 2300° C. (step (a)), prior to growing a group III nitride single crystal layer over the base substrate. Details of the thermal treatment will be described in the following.

<2.2 (a) Thermal Treatment Step>

The thermal treatment of the base substrate (step(a)) is carried out so as to make residual stress in the base substrate relax. The thermal treatment of the base substrate is carried out by keeping the base substrate at a constant temperature of 1000 to 2300° C. for at least 60 seconds. A higher temperature is preferred for the temperature of the thermal treatment, and the thermal treatment temperature may be suitably selected within the above temperature range considering a substrate temperature in a growth step (step (b)). In one embodiment, the thermal treatment temperature may be selected from a range which is within the range of 1000 to 2300° C. and which is close to the substrate temperature (growth temperature) in the growth step (step (b)) (preferably within the range of ±100° C. from the growth temperature, more preferably within the range of ±50° C. from the growth temperature).

As an atmosphere gas during the thermal treatment, a gas which does not react with the base substrate is preferably used. As the atmosphere gas, one gas may be used alone, or a mixed gas of at least two gases may be used. Among them, one or more gas selected from hydrogen gas, nitrogen gas, noble gases such as argon gas and helium gas, raw material gases of the group III nitride single crystal such as ammonia gas, halogen gases such as chlorine gas and bromine gas, and hydrogen halide gases such as hydrogen chloride and hydrogen bromide, is preferably used, in view of not damaging the base substrate. In view of improving crystal quality of the group III nitride single crystal layer grown in the step (b), the atmosphere gas during the thermal treatment preferably comprises a halogen gas, a hydrogen halide gas, and/or ammonia gas, and especially preferably comprises a halogen gas and/or a hydrogen halide gas. The supply of the atmosphere gas is not particularly limited, and may be determined depending on the volume of a reactor; in general, the supply is, for example, preferably 50 to 50000 sccm, more preferably 100 to 20000 sccm. In the present description, sccm is a unit of mass flow which means flow per 1 minute in terms of volume (cc) at the standard state (0° C., 1 atm). It is preferred to remove impurity gases such as oxygen, water vapor, carbon monoxide, and carbon dioxide, in advance from the gas to be supplied, by means of a gas purifier.

A time spent for heating (raising the temperature) before the thermal treatment is preferably determined such that stress or cracks do not occur in the base substrate. To be specific, it is preferably 1 minute to 15 hours, and especially preferably 1 minute to 5 hours in view of process efficiency.

As a heating apparatus, it is preferred to employ such a production apparatus of a group III nitride single crystal that does not cause damage (such as cracking of the substrate, decomposition of the surface, adhesion of impurities, and contamination by foreign matters) to the base substrate. An apparatus which is separate from the production apparatus of the group III nitride single crystal may be employed as the heating apparatus, if the apparatus is composed of members which do not affect the base substrate, such as the apparatus described in the Patent Literature. A structure which supports the base substrate is preferably such a structure that there is no position locally abnormally heated in the face of the base substrate. Examples of such a supporting structure include a structure which makes the entire underside surface contact with a susceptor. Further, if the base substrate is fixed, it is preferred to employ such a material that difference between the material and the base substrate in thermal expansion is small, to prevent cracking of the substrate due to thermal expansion difference. If a damage to the base substrate surface is expected, it is preferred to process the surface. The heating apparatus may be either a continuous-type apparatus or a batch-type apparatus; the batch-type apparatus is more preferable in view of process efficiency.

In the production method of the present invention, after the thermal treatment of the base substrate (step (a)), a group III nitride single crystal layer is grown by vapor phase epitaxy over the main surface which has a surface roughness (arithmetical mean height Sa) of no more than 0.5 nm (step (b)). If the surface roughness (arithmetical mean height Sa) of the base substrate after the step (a) is no more than 0.5 nm, the step (b) can be carried out on the base substrate as obtained without additional treatment. Even if the surface roughness (arithmetical mean height Sa) of the base substrate before the step (a) is no more than 0.5 nm, however, the surface roughness (arithmetical mean height Sa) of the base substrate after the step (a) may become greater than 0.5 nm. Plausible causes of such an increase of the surface roughness of the base substrate by experiencing the step (a) include: roughening of the main surface during the thermal treatment, which leads to loss of flatness of the surface; adhesion of foreign matters onto the surface; and a change of the surface profile accompanying relaxation of residual stress of the base substrate. In one embodiment, after completing the step (a) and before carrying out the step (b), the base substrate may be cooled to the ambient temperature and the surface roughness of the main surface of the base substrate may be measured. The average rate of the cooling may be, for example, preferably 1 to 170 K/min. As a result of the measurement, if the surface roughness (arithmetical mean height Sa) of the main surface of the base substrate is greater than 0.5 nm, a step of reducing the surface roughness (arithmetical mean height Sa) of the main surface of the base substrate to 0.5 nm or less (planarizing step) may be carried out, and the step (b) may be carried out after the planarizing step. As the result of the measurement, on the other hand, if the surface roughness (arithmetical mean height Sa) of the main surface of the base substrate is no more than 0.5 nm, the step (b) may be carried out without carrying out the planarizing step. Examples of means to reduce the surface roughness (arithmetical mean height Sa) of the main surface of the base substrate to 0.5 nm or less in the planarizing step include: polishing, washing, and thermal cleaning. Among them, in view of ease of fine surface control, polishing may be preferably employed, and chemomechanical polishing (CMP) may be especially preferably employed. In CMP, known slurries such as silica slurry and alumina slurry may be employed. If it is known in advance that the surface roughness (arithmetical mean height Sa) of the main surface after the step (a) becomes 0.5 nm or less under the same conditions, the step (b) may be carried out on the base substrate as obtained without cooling of the substrate and measurement of the surface roughness. In the present description, the surface roughness (arithmetical mean height Sa) of the main surface of the base substrate is a value calculated based on results of observation of a square-shaped field of 2 μm in length×2 μm in width arranged in the center of the main surface by means of atomic force microscopy (AFM).

<2.3 (b) Growth Step>

In the production method of the group III nitride single crystal of the present invention, a group III nitride single crystal layer is grown over the main surface of the base substrate after the step (a) by means of vapor phase epitaxy (step (b)), to produce a group III nitride single crystal. As the growth method in the step (b), a known vapor phase growth method may be employed without particular limitation. Examples of vapor phase growth methods include sublimation (PVT) method, metalorganic vapor phase epitaxy (MOCVD), and hydride vapor phase epitaxy (HVPE). Among them, PVT or HVPE method is preferred in that they can grow a single crystal of good crystal quality at a high growth rate.

In the following, the step (b) will be described in detail, giving examples of HVPE method and PVT method.

<2.3.1 Growth of Group III Nitride Single Crystal by HVPE Method>

In growth of the group III nitride single crystal layer by HVPE method, a conventional HVPE apparatus such as a horizontal flow reactor and a vertical perpendicular flow reactor may be employed. For example, an apparatus which can supply raw material gases and a carrier gas from the upstream side of the substrate and can exhaust a reaction product gas from the downstream side, can adjust gas supply by means of a mass flow controller, and can heat the base substrate by e.g. high-frequency heating or resistance heating, and whose members are coated with a material which does not react with the raw material gases or the reaction product gas and does not decompose at high temperature, may be preferably used. A batch-type apparatus which can grow group III nitride single crystal layers over a plurality of base substrates at the same time may be particularly preferably employed.

<2.3.1.1 Carrier Gas>

If HVPE method is employed as the vapor phase growth method in the step (b), it is preferred to supply a carrier gas into the reactor to form a flow of raw material gases (a group III raw material gas and a nitrogen source gas), so as to the supply raw material gases onto the base substrate in a reactor. As the carrier gas, hydrogen gas and/or various inert gases may be used. As the carrier gas, one gas may be used alone, or a mixed gas of at least two gases may be used. Among them, in view of not disadvantageously affect the production of the group III nitride single crystal, one or more gases selected from hydrogen gas and nitrogen gas is preferably used as the carrier gas. The supply of the carrier gas may be suitably determined depending on the volume of the reactor; in general, it is for example preferably 50 to 50000 sccm, more preferably 100 to 10000 scan. It is also preferred to remove impurity gases such as oxygen, water vapor, carbon monoxide, and carbon dioxide from the carrier gas in advance, by means of a gas purifier.

<2.3.1.2 Group III Raw Material Gas>

As the group III raw material gas, a known group III raw material gas used when producing a group III nitride single crystal may be used without particular limitations. Among them, the advantageous effect of the present invention is significant when a group III raw material gas containing aluminum is used. For example, in HVPE method, an aluminum halide gas such as aluminum chloride gas and aluminum iodide gas is preferably used. Aluminum halide gases are preferred as the group III raw material gas used in the present invention because they have high reactivity and offer a high growth rate.

The aluminum halide gas may be obtained by vaporizing a solid aluminum halide, or may be obtained by reacting metal aluminum with a halogen-based gas for raw material formation such as hydrogen chloride gas and chloride gas. When an aluminum halide gas is produced from metal aluminum, a solid of 99.99% or more in purity is preferably used as aluminum as the raw material of the aluminum halide gas. The dimensions and shape of the solid aluminum is not particularly limited; in view of contact efficiency of aluminum and the halogen-based gas for raw material formation and a flow path resistance of the halogen-based gas, a pellet-shape of 0.1 to 10 mm in diameter and 0.1 to 10 mm in length may be preferably used.

For another example, the aluminum halide gas may be obtained by a reaction of a metal-organic gas containing aluminum and a halogen-based gas for raw material formation.

The group III raw material gas is preferably supplied onto the base substrate together with the carrier gas. When supplying the group III raw material gas as diluted with the carrier gas, the concentration of the group III raw material gas in a mixed gas of the group III raw material gas and the carrier gas may be, for example, 0.0001 to 10% by volume. The supply of the group III raw material gas may be, for example, 0.005 to 500 sccm.

<2.3.1.3 Nitrogen Source Gas>

In HVPE method, a nitrogen source gas is suppled onto the base substrate. As the nitrogen source gas, a reactive gas containing nitrogen may be employed; in view of cost and ease of handling, ammonia gas is preferably used.

The nitrogen source gas is supplied on the base substrate, usually as suitably diluted in the carrier gas. When supplying the nitrogen source gas onto the base substrate together with the carrier gas, the supply of the nitrogen source gas and the supply of the carrier gas may be determined depending on e.g. volume of the reactor.

In view of ease of production of the group III nitride single crystal, the supply of the carrier gas is preferably 50 to 10000 sccm, and more preferably 100 to 5000 sccm. The concentration of the nitrogen source gas in a mixed gas of the nitrogen source gas and the carrier gas may be, for example, 0.001 to 10% by volume. The supply of the nitrogen source gas is preferably 0.01 to 1000 sccm.

<2.3.1.4 Halogen-Based Gas>

The reaction of the group III raw material gas and the nitrogen source gas may also be conducted in the presence of at least one halogen-based gas selected from hydrogen halide gases and halogen gases. Examples of the halogen gas include chlorine gas and bromine gas. Examples of the hydrogen halide gas include hydrogen chloride gas and hydrogen bromide gas. Among them, hydrogen halide gas is preferably used as the halogen-based gas, in view of low corrosiveness against gas conduits, ease of handling, and cost. So as to obtain a group III nitride single crystal of higher quality, it is preferred to supply as the group III raw material gas a mixed gas obtained by further mixing the aluminum halide gas with an additional halogen-based gas, as described in Patent Literature 4. Further, a barrier gas may be supplied from a gap between a nozzle supplying the group III raw material gas and a nozzle supplying the nitrogen source gas, so as to control mixing of the group III raw material gas and the nitrogen source gas, as described in Patent Literature 6.

<2.3.1.5 Temperature of Base Substrate>

As the temperature of the base substrate during crystal growth (growth temperature), a conventional growth temperature may be employed without particular limitation. To be specific, the growth temperature is preferably 1000 to 1700° C. When an aluminum-based group III nitride single crystal, in particular an aluminum nitride single crystal is produced using an aluminum halide gas, the temperature of the base substrate (growth temperature) is preferably 1200 to 1600° C. In such a case, the supply of the aluminum halide gas is preferably 0.001 to 100 sccm.

<2.3.1.6 Order of Supplying Gases>

In HVPE method, growth of a group III nitride single crystal layer is begun by supplying both a group III raw material gas and a nitrogen source gas are supplied onto a heated base substrate. The order of beginning supply of the group III raw material gas, the nitrogen source gas, and the halogen-based gas onto the base substrate is not particularly limited. Supply of gases may be begun, for example, in the sequence set forth: (i) the halogen-based gas, the nitrogen source gas, and the group II raw material gas; (ii) the nitrogen source gas, the halogen-based gas, and the group III raw material gas; (iii) the halogen-based gas, the group III raw material gas, and the nitrogen source gas; (iv) the group III raw material gas, the halogen-based gas, and the nitrogen source gas; (v) the nitrogen source gas, the group III raw material gas, and the halogen-based gas; or (vi) the group III raw material gas, the nitrogen source gas, and the halogen-based gas. For another example, two or three gases selected from the group III raw material gas, the nitrogen source gas, and the halogen-based gas may be mixed and supplied as a mixed gas. For another example, supply of two or three gases selected from the group III raw material gas, the nitrogen source gas, and the halogen-based gas may be begun at the same time from separate gas supply pipes. In view of improving crystal quality of the group III nitride single crystal layer to be grown, it is preferred to begin supplying gases in the sequence of the (i). That is, it is preferred to begin growth of the group III nitride single crystal layer by (i-1) beginning to supply the halogen-based gas, and then (i-2) beginning to supply the nitrogen source gas, and finally (i-3) beginning to supply the group III raw material gas.

<2.3.1.7 Growth Rate of Group III Nitride Single Crystal>

It is preferred to supply a sufficient amount of the aluminum halide gas, such that the growth rate of the aluminum-based group III nitride single crystal layer becomes 10 μm/h or more, more preferably 15 μm/h or more. Although the upper limit of the growth rate is not particularly limited, it may be for example 300 μm/h or less in view of improving crystal quality.

<2.3.1.8 Thickness of Group III Nitride Single Crystal Layer>

The thickness of the group III nitride single crystal layer to be grown is not particularly limited, and it may be suitably determined depending on desired use of the group III nitride single crystal substrate to be produced. It is usually 50 to 2000 μm.

<2.3.1.9 Pressure in Reactor>

The pressure in the reactor may be suitably determined depending on e.g. raw materials used. During growth of the group III nitride single crystal, the pressure in the reactor is preferably 0.2 to 1.5 atm.

<2.3.1.10 Cooling of Group III Nitride Single Crystal after Growth>

Cooling of the group III nitride single crystal after growth is preferably carried out at such a rate that stress or a crack does not occur in the base substrate. To be specific, the time spent for the cooling is preferably 10 minutes to 15 hours, and preferably 30 minutes to 6 hours in view of process efficiency.

<2.3.2 Growth of Group III Nitride Single Crystal by PVT Method>

In the step (b), the group III nitride single crystal layer may be grown by PVT method. Conventional conditions may be employed for crystal growth conditions of PVT method. Examples of materials employable as the material of a crucible used in PVT method include: metals such as tungsten, tantalum, and zirconium; carbides thereof such as tungsten carbide and tantalum carbide; graphite; aluminum nitride; and boron nitride. A common crucible comprises a cylindrical outer shape, and a base substrate is arranged on one side of the inside of the crucible on one hand, and a group III nitride raw material is arranged on the opposite side of the inside of the crucible on the other hand. As the group III nitride raw material, a group III nitride powder or a sintered group III nitride may be used. Preferably, the group nitride powder or the sintered group III nitride is heated at 1800 to 2500° C. to reduce impurities such as oxygen, silicon, and carbon in advance, and thus obtained group III nitride with reduced impurities is preferably used as the raw material. For another example, the group III nitride raw material may be obtained by reacting a group III metal of high purity with a nitrogen source gas such as nitrogen gas or ammonia gas at a temperature equal to or greater than the melting point of the metal.

A PVT reactor, in one embodiment, comprises a water-cooled quartz double tube structure comprising a inner tube and an outer tube, and the crucible is arranged inside the inner tube of the quartz double tube. The inside of the PVT reactor has a structure such that an inert gas such as nitrogen gas, argon gas, and helium gas can be supplied, and nitrogen gas alone or a mixed gas comprising nitrogen gas is supplied when growing a group III nitride single crystal layer. The PVT reactor comprises an exhaust system which is connected to a vacuum pump such that oxidizing components such as oxygen gas and water in the system can be efficiently exhausted. The pressure in the reactor may be suitably adjusted within the range of 1 to 1000 Torr. Further, a halogen-based gas such as hydrogen chloride gas and chlorine gas may be supplied into the PVT reactor. It is possible to facilitate removal of e.g. impurities, deposits of the group III nitride, and foreign matters in the reactor, as well as to control a driving force of deposition of the group III nitride single crystal, by supplying the halogen-based gas suitably in an amount of 0.01 to 10% by volume on the basis of the total gas volume in the reactor while heating the inside of the reactor.

The crucible may be heated by high-frequency heating or resistive heating. When high-frequency heating is employed, (a) a high-frequency wave may be directly applied to the crucible, or (b) a heatable part to which the high-frequency wave can be applied may be provided around the outside of the crucible, and the crucible may be indirectly heated by making a heat generated in the heatable part be transferred to the crucible. One heating method of them may be employed alone, or both of them may be employed in combination. Inside the crucible, e.g. a tapered structure, a protrusion structure, a hollow structure, or a curved structure may be suitably provided such that a temperature distribution suitable for deposition of the group III nitride single crystal substrate is realized.

The group III nitride single crystal layer can be grown over the base substrate by: heating the group III nitride raw material at 1800 to 2500° C., to decompose the group III nitride raw material into a group III nitride raw material gas; making the group III nitride raw material gas diffuse and be transported to the base substrate; and making the group III nitride deposit from the group III nitride raw material gas onto the base substrate. During this, the temperature of the base substrate (growth temperature) is suitably selected from the range which is within the range of 1600 to 2300° C. and is equal to or lower than the heating temperature of the group III nitride raw material. The substrate is maintained at the growth temperature until a desired film thickness is obtained, to grow the group III nitride single crystal layer. Thereafter the substrate is cooled to the room temperature at a cooling rate of 1 to 1000 K/h, and then a layered body comprising the base substrate and the group III nitride single crystal layer is taken out from the reactor.

<2.4 Process after Production>

The obtained group III nitride single crystal substrate may be preferably used for fabrication of electronic devices comprising an aluminum-based group III nitride (mainly aluminum gallium nitride mixed crystal) semiconductor, such as light emitting devices, Schottky barrier diodes, and high electron mobility transistors. The obtained group III nitride single crystal substrate may be subjected to grinding, and then to planarization of the surface by grinding, and thereafter to chemomechanical polishing (CMP) to remove a damaged layer formed by the grinding of the surface, to give a group III nitride single crystal substrate having a flat surface. Alternatively, a new group III nitride single crystal substrate consisting of the group III nitride single crystal layer grown over the base substrate may be obtained by removing the base substrate by a conventional process method such as mechanical cutting, laser cutting, or grinding. Grinding and chemomechanical polishing (CMP) may be carried out by conventional methods. An abrasive comprising a material such as silica, alumina, ceria, boron carbide, boron nitride, and diamond may be used. The nature of the abrasive may be any of alkaline, neutral, and acidic. Among them, a weak alkaline, neutral or acidic abrasive is preferably used rather than a strong alkaline abrasive, since nitrogen face (−c-face) of aluminum nitride has low alkaline resistance: to be specific, an abrasive of 9 or less in pH is preferably used. Of course, if a protective film is formed over the nitrogen face, a strong alkaline abrasive may be used without any problem. An additive such as an oxidant may be added so as to increase polishing rate. A commercially available polishing pat may be used, and its material and hardness is not particularly limited.

EXAMPLES

Hereinafter the present invention will be explained in detail with Examples. However, the present invention is not limited to the following Examples. Obtained group III nitride single crystal substrates were evaluated by Nomarski differential interference contrast microscopy, observation by X-ray reflection topography, measurement of impurity concentrations, measurement of surface roughness (flatness), measurement of micro-Raman spectra, and observation by white-light interference microscopy. Details of evaluation methods are as in the following.

<Observation by Nomarski Differential Interference Contrast Microscopy>

A group III nitride single crystal substrate was observed in a bright field with a magnification of 100 to 500 times, by means of a Nomarski differential interference contrast microscope (LV150 manufactured by Nikon Corporation).

<Evaluation by X-Ray Reflection Topography>

For a measurement by X-ray reflection topography, a high-resolution thin film X-ray diffractometer (X'Pert Pro MRD manufactured by PANalytical B.V.) was used. From a Cu-target X-ray tube, characteristic X-ray (direct beam intensity: 40000 cps) was generated under the conditions of 45 kV of acceleration voltage and 40 mA of filament current, whereby X-ray beam was taken out by line focus. The generated X-ray beam was reflected by an X-ray mirror module (Goebel mirror) to give a horizontal X-ray beam of high intensity. The X-ray mirror module was equipped with a ½° divergence slit (lateral limitation slit) and a vertical limitation slit of 50 μm in width, the both being arranged at the entrance of the X-ray mirror module, to make the X-ray beam narrowed to approximately 1.2 mm in beam width. The X-ray beam was irradiated onto an aluminum nitride substrate arranged on a measurement stage. The CuKα1 ray diffracted from (114) plane of the aluminum nitride single crystal substrate was detected by a two-dimensional semiconductor X-ray detector (PIXcel 3D semiconductor detector manufactured by PANalytical B.V.), whereby an X-ray reflection topography image was acquired. Image analysis of the acquired X-ray reflection topography image was carried out.

<Evaluation of Impurity Concentrations>

As regards impurity concentrations of a group III nitride single crystal substrate and a base substrate, concentrations of silicon atoms, oxygen atoms, and carbon atoms were determined by secondary ion mass spectrometry (IMS-f6 manufactured by CAMECA Instruments Inc.) using cesium ion (acceleration voltage: 15 kV) as the primary ion. Secondary ion intensities at an analysis depth of 2 μm from the surface were measured, and silicon concentration, oxygen concentration, and carbon concentration were determined based on a calibration curve which had been separately prepared using an AlN standard sample.

<Evaluation of Surface Roughness>

Surface roughness of a base substrate was evaluated by calculating arithmetic mean height (Sa) based on results of observation of a square-shaped field of 2 μm in length×2 μm in width arranged in the center of the main surface by means of an atomic force microscope (Nano-R system manufactured by Pacific Nanotechnology, Inc.). When there was such a large pit or scratch in the center of the main surface that made it impossible to set the field of 2 μm in length×2 μm in width for AFM observation in the center of the main surface, the field of 2 μm in length×2 μm in width was set in the position shifted by 1 mm from the center of the main surface.

<Evaluation of Wave Number of Micro-Raman Spectrum>

Wave numbers of micro-Raman spectra were evaluated by means of NRD-7100 micro-Raman spectrometer manufactured by JASCO Corporation. A laser of 531.98 nm in wavelength was used as an excitation laser. A slit of 10 μm in width×1000 μm in length, and a grating of 600 lines/mm were used. The excitation laser (output power: 10.8 mW) was concentrated through an objective lens of 100 times magnification such that the diameter of a measurement spot became about 1 μm, and was irradiated to a group III nitride single crystal, to acquire a local Raman spectrum. Three spectra each acquired with an exposure time of 5 seconds were averaged. Wave numbers of measured Raman spectra were calibrated based on a Raman shift of 521.448 cm$^{-}$in wave number which was a Raman shift of a silicon substrate measured under the same conditions. $E_2^{high}$ Raman shift peaks of measured group III nitride single crystals were fitted with Lorentzian functions to give peak wave numbers thereof. Measurement spots in the inner region were: when one or more bright spot(s) was/were observed in the X-ray reflection topography image, micro-Raman spectra were measured for at least 3 spots in the inner region, the at least 3 spots including all of the bright spot(s); when no bright spot was observed in the X-ray reflection topography image, micro-Raman spectra were measured for the center of the main surface and at least 2 spots randomly selected from the inner region (i.e. at least 3 spots in total). Measurement spots of micro-Raman spectra in the outer region were at least 3 spots arranged at regular intervals (2 mm) along the entire length of a part of a line segment, the line segment connecting the center of the main surface and the periphery, and the part being included in the outer region.

The ratio of the difference between the minimum value of peak wave numbers of micro-Raman spectra in the inner region ($v_A$) and the average value of peak wave numbers of micro-Raman spectra in the outer region ($v_B$) to the average value of peak wave numbers of micro-Raman spectra in the outer region ($v_B$) was calculated by the following formula.

$$100 \times (v_A - v_B)/v_B (\%)$$

<Observation by White-Light Interference Microscopy>

Pits after polishing treatment were observed by means of a white-light interference microscope (NewView 7300 manufactured by Zygo Corporation), using an objective lens of 10 times magnification.

Example 1

(Pretreatment of Base Substrate)

An aluminum nitride single crystal substrate of 536 μm in thickness, prepared by PVT method and having a circular main surface of 25 mm in diameter partly cut out as an orientation flat, was used as a base substrate. The base substrate had a silicon concentration of $5 \times 10^{18}$ cm$^{-3}$, an oxygen concentration of $7 \times 10^{18}$ cm$^{-3}$, and a carbon concentration of $8 \times 10^{18}$ cm$^{-3}$. The base substrate was subjected to ultrasonic cleaning with acetone and isopropyl alcohol. After the ultrasonic cleaning of the base substrate, the base substrate was placed on a susceptor made of BN-coated graphite in a HVPE apparatus.

(Step (a): Thermal Treatment of Base Substrate)

The pressure in the HVPE apparatus was changed to 0.99 atm. The base substrate was heated from the room temperature to 1475° C. in 20 minutes, while supplying 3512 sccm of nitrogen gas, 6848 sccm of hydrogen gas, and 10 sccm of ammonia gas onto the base substrate. After 4 minutes and 30 seconds of keeping under the same conditions, the base substrate was cooled to the room temperature and was taken out from the apparatus. The surface roughness (arithmetical mean height Sa) of the main surface (Al-face) of the base substrate at this time was 0.6 nm.

(Process of Base Substrate)

The surface (Al-face) of the base substrate after the thermal treatment was subjected to grinding by #170 to #3000, and then to chemomechanical polishing (CMP). The base substrate after polishing was 465 μm in thickness and 0.08 nm in surface roughness (arithmetical mean height Sa).

(Step (b): Growth of Aluminum Nitride Single Crystal Layer)

The base substate was washed in the same manner as in the pretreatment, and then was placed on the susceptor made of BN-coated graphite in the HVPE apparatus. As a push gas, a hydrogen-nitrogen mixed carrier gas of hydrogen gas and nitrogen gas mixed in a flow rate ratio (sccm/sccm) of 8:2 was used, and its total amount of flow was 6500 sccm. The pressure in the reactor was kept at 0.99 atm during growth. Thereafter the base substrate was heated at 1475° C.

Into the reactor were supplied 40 sccm of ammonia gas (nitrogen source gas) from a nitrogen source gas supply nozzle and 54 sccm of hydrogen chloride gas from a group III additional halogen-based gas supply nozzle on one hand. Hydrogen chloride was reacted with metal aluminum of 99.99% or more in purity to generate aluminum chloride gas (group III raw material gas), and the aluminum chloride gas was supplied from a group III raw material gas supply nozzle into the reactor on the other hand. Thus the group III raw material gas, the nitrogen source gas, and hydrogen chloride gas were supplied onto the base substrate, to grow an aluminum nitride single crystal layer of about 30 μm in thickness over the main surface of the base substrate by HVPE method. After growth of the aluminum nitride single crystal layer, supply of ammonia gas, hydrogen chloride gas, and aluminum chloride gas was stopped, and the substrate was cooled to the room temperature, and thereafter the aluminum nitride single crystal substrate was taken out from the apparatus.

The wave number deviation ratio of the peak wave number of the micro-Raman spectra of thus obtained aluminum nitride single crystal substrate was measured to be −0.03%. No hillock was observed in the inner region by Nomarski differential interference contrast microscopy. No bright spot was observed in the inner region in an X-ray reflection topography image of the aluminum nitride single crystal layer.

(Polishing of Aluminum Nitride Single Crystal Substrate)

The surface (Al-face) of the obtained aluminum nitride single crystal substrate was processed in the same manner as in the process of the base substrate. The back face (N-face) of the base substrate) was mirror-finished by planarizing by grinding and CMP polishing. No pit was observed in white-light interference microscope observation of the aluminum nitride single crystal substrate after the process.

(Evaluation of Impurity Concentration of Aluminum Nitride Single Crystal Layer)

The aluminum nitride single crystal layer of the obtained group III nitride single crystal substrate had a silicon concentration of $1.3 \times 10^{17}$ cm$^{-3}$, an oxygen concentration of $5.5 \times 10^{17}$ cm$^{-3}$, and a carbon concentration of $8 \times 10^{15}$ cm$^{-3}$. The ratio of the total concentration of silicon, oxygen, and carbon in the obtained aluminum nitride single crystal layer to the total concentration ($6.9 \times 10^{17}$ cm$^{-3}$) of silicon, oxygen, and carbon in the base substrate (=single crystal layer/base substrate) was 0.03.

Examples 2 to 13, and Comparative Examples 1 to 5

Except that the thermal treatment of the base substrate was carried out under the conditions shown in Table 1, aluminum nitride single crystal substrates were produced under the same conditions as in Example 1. It is noted, though, in the step (b) in Examples 5 and 6, gases were begun to supply in the sequence set forth: hydrogen chloride gas, ammonia gas, and aluminum chloride gas. Results are shown in Table 2. In any of Examples 1 to 7 and 9 to 13, no hillock was observed in the inner region of the substrate (the aluminum nitride single crystal layer) by Nomarski differential interference contrast microscopy, no bright spot was observed in the inner region of the substrate (the aluminum nitride single crystal layer) by image analysis of an X-ray reflection topography image, peak wave numbers of micro-Raman spectra showed the lowest value in the center of the substrate, and no pit was observed after polishing. In Example 8, in the inner region of the substrate were observed a hillock by Nomarski differential interference contrast microscopy and a bright spot by image analysis of an X-ray reflection topography image respectively, although they were very small in size. In Example 8, peak wave numbers of micro-Raman spectra showed the lowest value in the center of the substrate, and no pit was observed after polishing.

In any of Comparative examples 1 to 5, were observed a hillock by Nomarski differential interference contrast microscopy and a bright spot by image analysis of an X-ray reflection topography image respectively, both in the same position (i.e. central defect part) in the inner region of the substrate. Peak wave numbers of micro-Raman spectra showed the lowest value in the central defect part. After polishing, a pit was observed in the central defect part where the hillock and the bright spot had been observed.

TABLE 1

|  |  | Atmosphere gas supply (sccm) | Substrate temperature | Keeping time | Planarizing step | Surface roughness (nm) |
|---|---|---|---|---|---|---|
| Examples | 1 | N₂/H₂/NH₃ 3512/6848/10 | 1475° C. | 4 m 30 s | performed | 0.08 |
|  | 2 | N₂/H₂/NH₃ 3512/6848/10 | 1475° C. | 4 m 30 s | performed | 0.07 |
|  | 3 | N₂/H₂/NH₃ 3512/6848/10 | 1475° C. | 4 m 30 s | performed | 0.08 |
|  | 4 | N₂/H₂/NH₃ 3512/6848/10 | 1475° C. | 4 m 30 s | performed | 0.06 |
|  | 5 | N₂/H₂/HCl 3512/6848/57 | 1475° C. | 4 m 30 s | performed | 0.06 |
|  | 6 | N₂/H₂/HCl 3512/6848/108 | 1500° C. | 2 m | none | 0.21 |
|  | 7 | N₂/N₂/NH₃ 3512/6848/10 | 1475° C. | 11 h | performed | 0.06 |
|  | 8 | N₂/H₂ 3512/6858 | 1100° C. | 5 m | none | 0.19 |
|  | 9 | N₂ 10000 | 1475° C. | 4 m 30 s | performed | 0.21 |
|  | 10 | N₂ 10000 | 1475° C. | 11 h | performed | 0.06 |
|  | 11 | N₂ 10000 | 1475° C. | 11 h | performed | 0.07 |
|  | 12 | N₂/H₂/NH₃ 3512/6848/10 | 1475° C. | 4 m | performed | 0.07 |
|  | 13 | N₂ 10000 | 2000° C. | 4 m | performed | 0.25 |
|  | 14 | N₂ 5000 | 1800° C. | 20 m | performed | 0.15 |
| Comparative examples | 1 | N₂/H₂/NH₃ 3512/6848/10 | 1000° C. | 25 s | none | 0.06 |
|  | 2 | N₂/H₂/NH₃ 3512/6848/10 | 1475° C. | 4 m 30 s | none | 0.53 |
|  | 3 | N₂/H₂ 3512/6858 | 1475° C. | 25 s | none | 0.39 |
|  | 4 | N₂/H₂/NH₃ 3512/6848/10 | 1700° C. | 4 m | none | 1.07 |
|  | 5 | no thermal treatment | — | — | none | 0.10 |
|  | 6 | no thermal treatment | — | — | none | 0.15 |

TABLE 2

|  |  |  | Central defect part | | Raman spectra | | | Ratio of total impurity (Si, O, C) | Total impurity | Total impurity concentration of group III |
|---|---|---|---|---|---|---|---|---|---|---|
|  |  | Growth method | found or not | Distance from center (%) | Wave number deviation ratio (%) | Position of the lowest peak wave number | Pit after polishing | concentrations (single crystal layer/base substrate) | concentration of base substrate (cm⁻³) | nitride single crytal layer (cm⁻³) |
| Examples | 1 | HVPE | no | — | −0.03 | central part | none | 0.03 | 2.0E+19 | 6.9E+17 |
|  | 2 | HVPE | no | — | 0.00 | central part | none | 2.9 | 4.0E+17 | 1.2E+18 |
|  | 3 | HVPE | no | — | 0.01 | central part | none | 0.09 | 2.0E+19 | 1.7E+18 |
|  | 4 | HVPE | no | — | −0.03 | central part | none | 23 | 4.0E+17 | 9.1E+18 |
|  | 5 | HVPE | no | — | 0.00 | central part | none | 0.15 | 2.0E+19 | 2.9E+18 |
|  | 6 | HVPE | no | — | −0.02 | central part | none | 0.43 | 2.0E+19 | 8.5E+18 |
|  | 7 | HVPE | no | — | 0.02 | central part | none | 0.09 | 2.0E+19 | 1.7E+18 |
|  | 8 | HVPE | found | 5 | 0.05 | central part | none | 0.35 | 5.0E+18 | 1.7E+18 |
|  | 9 | HVPE | no | — | 0.03 | central part | none | 0.06 | 2.6E+19 | 1.5E+18 |
|  | 10 | HVPE | no | — | 0.00 | central part | none | 0.06 | 2.6E+19 | 1.5E+18 |
|  | 11 | HVPE | no | — | 0.04 | central part | none | 0.003 | 2.6E+19 | 9.0E+16 |
|  | 12 | HVPE | no | — | 0.02 | central part | none | 0.09 | 2.0E+19 | 1.7E+18 |
|  | 13 | HVPE | no | — | −0.02 | central part | none | 0.09 | 2.0E+19 | 1.7E+18 |
|  | 14 | PVT | found | 11 | −0.03 | central part | none | 0.02 | 2.6E+19 | 4.0E+17 |

TABLE 2-continued

| | | Central defect part | | Raman spectra | | | Ratio of total impurity (Si, O, C) concentrations (single crystal layer/base substrate) | Total impurity concentration of base substrate (cm$^{-3}$) | Total impurity concentration of group III nitride single crytal layer (cm$^{-3}$) |
|---|---|---|---|---|---|---|---|---|---|
| | Growth method | found or not | Distance from center (%) | Wave number deviation ratio (%) | Position of the lowest peak wave number | Pit after polishing | | | |
| Comparative examples 1 | HVPE | found | 22 | −0.11 | central defect part | found (central defect part) | 0.09 | 2.0E+19 | 1.7E+18 |
| 2 | HVPE | found | 12 | −0.15 | central defect part | found (central defect part) | 0.09 | 2.0E+19 | 1.7E+18 |
| 3 | HVPE | found | 14 | −0.12 | central defect part | found (central defect part) | 0.09 | 2.0E+19 | 1.7E+18 |
| 4 | HVPE | found | 3 | −0.21 | central defect part | found (central defect part) | 0.09 | 2.0E+19 | 1.7E+18 |
| 5 | HVPE | found | 26 | −0.12 | central defect part | found (central defect part) | 0.09 | 2.0E+19 | 1.7E+18 |
| 6 | PVT | found | 6 | −0.29 | central defect part | found (central defect part) | 0.02 | 2.6E+19 | 4.0E+17 |

Example 14

An aluminum nitride single crystal substrate of 50.8 mm in diameter and 580 μm in thickness prepared by PVT method was used as a base substrate. The base substrate was washed in the same manner as in Example 1. Then the base substrate was placed on a susceptor made of BN-coated graphite in a thermal treatment apparatus, such that Al-face of the substrate was in an upward direction. While maintaining the pressure in the thermal treatment apparatus at 1.2 atm, 5000 sccm of nitrogen gas was supplied into the thermal treatment apparatus on one hand, and the base substrate was heated to 1800° C. in 20 minutes on the other hand. After 20 minutes of keeping under the same conditions, the base substrate was cooled in 30 minutes, and the base substrate was taken out from the apparatus. The surface roughness (arithmetical mean height Sa) of the main surface (Al-face) of the base substrate was measured to be 0.62 nm. The main surface (Al-face) of the base substrate was subjected to chemomechanical polishing (CMP), to make the surface roughness (arithmetical mean height Sa) of the main surface 0.15 nm. At this time, the base substrate was 565 μm in thickness.

Next, the base substrate was placed in a crucible made of tungsten on one hand, and an aluminum nitride raw material was placed in the crucible in the position opposite from the base substrate on the other hand. The aluminum nitride raw material had been thermally treated at 2200° C. to reduce impurities in advance. That is, the base substrate and the group III nitride raw material were placed in opposite positions in the single crucible. Then the tungsten crucible was placed in a PVT reactor comprising a water-cooled quartz double tube. So as to remove residual oxygen content and residual water content in the reactor, the pressure in the system was reduced to 5 Torr or less, and then nitrogen gas whose dew point was controlled to be −110° C. or less was filled in the system, to make the pressure in the system be 760 Torr. After repeating the depressurizing and the nitrogen gas filling 3 times, the pressure in the system was controlled to be constant at 800 Torr by means of a pressure controller. Then heating was begun by applying a high-frequency wave to the tungsten crucible by means of a high-frequency induction heating apparatus. The temperature of the base substrate was ramped to 1850° C. while maintaining the temperature of the aluminum nitride raw material lower than the temperature of the base substrate by 50° C., and thereafter the temperature of the aluminum nitride raw material was ramped to 2100° C. in 1 hour while maintaining the temperature of the base substrate at 1850° C., to promote decomposition of the aluminum nitride raw material on one hand and begin growth of an aluminum nitride single crystal layer over the base substrate on the other hand. By 48 hours of keeping while maintaining temperatures of the base substrate and the aluminum nitride raw material constant, an aluminum nitride single crystal layer of 56 mm in largest diameter and 8 mm in thickness was grown over the base substrate.

Impurity concentrations of the base substrate were measured by secondary ion mass spectrometry to be: 6×10$^{18}$ cm$^{-3}$ in silicon concentration, 1×10$^{19}$ cm$^{-3}$ in oxygen concentration, and 1×10$^{19}$ cm$^{-3}$ in carbon concentration, which meant that the total concentration of major impurities were 2.6×10$^{19}$ cm$^{-3}$. Impurity concentrations of the obtained aluminum nitride single crystal layer was measured in the same manner to be: 1×10$^{17}$ cm$^{-3}$ in silicon concentration, 2×10$^{17}$ cm$^{-3}$ in oxygen concentration, and 8×10$^{16}$ cm$^{-3}$ in carbon concentration, which meant that the total concentration of major impurities were 3.8×10$^{17}$ cm$^{-3}$. The ratio of the total impurity concentrations of the base substrate and the group III nitride single crystal layer (=group III nitride single crystal layer/base substrate) was 0.02.

A very low hillock was observed in the obtained aluminum nitride single crystal layer by Nomarski differential interference contrast microscopy, in a position distant from the center of the substrate by 2.8 mm (11.0% of the distance from the center to the periphery). A bright spot was observed by image analysis of an X-ray reflection topography image of (114) diffraction plane of the aluminum nitride single crystal, in the same position as the hillock observed by Nomarski differential interference contrast microscopy, but the bright spot was obscure. The wave number deviation ratio of the $E_2^{high}$ peak in micro-Raman spectra of the aluminum nitride single crystal layer was analyzed to be −0.03%. No pit was observed after polishing.

Comparative Example 6

Except that the base substrate was not thermally treated, a group III nitride single crystal substrate was produced in the same manner as in Example 14. A hillock was observed in the obtained aluminum nitride single crystal layer by Nomarski differential interference contrast microscopy, in a position distant from the center of the substrate by 1.5 mm (6% of the distance from the center to the periphery). A clear bright spot was observed by image analysis of an X-ray reflection topography image acquired for (114) diffraction plane of the entire face of the aluminum nitride single crystal, in the same position as the hillock observed by Nomarski differential interference contrast microscopy. The wave number deviation ratio of the $E_2^{high}$ peak in micro-Raman spectra of the aluminum nitride single crystal layer was evaluated to be −0.29%. After polishing, a pit was observed in the central defect part at which the hillock and the bright spot had been observed.

REFERENCES SIGN LIST 10, 20, 30, 40 group III nitride single crystal substrate
11, 21, 31, 41 main surface
12, 22, 32, 42 periphery
13, 23, 33, 43 center
14, 24, 34, 44 inner region
15, 25, 35, 45 outer region
16, 26, 36, 46 boundary (between the inner region and the outer region)
17, 27, 37, 47 line segment (connecting the center and the periphery)
18, 28, 38, 48 internally dividing point
39 original circle
49 original hexagon

We claim:

1. A aluminum nitride single crystal substrate comprising a main surface,
the main surface having a face orientation of +c-face,
the main surface having:
    a circular shape; or
    a circular shape comprising a cutout of an orientation flat,
the substrate having a diameter of 20 to 210 mm,
the main surface comprising:
    a center;
    a periphery;
    an outer region comprising the periphery; and
    an inner region comprising the center,
wherein if the shape of the main surface has rotational symmetry, the center of the main surface is defined as a position of an axis of the rotational symmetry; and
if the shape of the main surface is the circular shape comprising the cutout of the orientation flat and does not have rotational symmetry, the center of the main surface is defined as a center of an original circle, wherein the original circle is defined as a circle whose periphery has a longest total overlap with the periphery of the main surface;
wherein a boundary separating the inner region and the outer region is defined as a trace drawn by a point when a line segment connecting the center and the periphery is rotated by a single rotation around the center wherein the point divides the line segment internally into a ratio of (distance from the center):(distance from the periphery) =3:7;
the outer region is defined as a region outside the boundary; and
the inner region is defined as a region inside the boundary comprising the boundary;
wherein a ratio $(v_A - v_B)/v_B$ is within the range of ±0.1%,
wherein $v_A$ is a minimum value of $E_2^{high}$ peak wave numbers of micro-Raman spectra measured in a plurality of positions in the inner region; and
$v_B$ is an average value of $E_2^{high}$ h peak wave numbers of micro-Raman spectra measured in a plurality of positions in the outer region;
wherein measurements of the micro-Raman spectra in the inner region are carried out by a first process comprising:
a) acquiring a X-ray reflection topography image of the main surface of the substrate, by detecting CuKα1 ray diffracted by (114) plane of the substrate;
b) if at least one bright spot is observed in the X-ray reflection topography image of the main surface obtained in the a), measuring micro-Raman spectra for at least 3 spots in the inner region, the at least 3 spots comprising all of the at least one bright spot; and
c) if no bright spot is observed in the X-ray reflection topography image of the main surface obtained in the a), measuring micro-Raman spectra for at least 3 spots comprising the center and at least 2 different spots other than the center randomly selected from the inner region;
wherein the X-ray reflection topography image of the main surface is acquired by a second process using a thin film X-ray diffractometer which is X'Pert Pro MRD from PANalytical B.V., the second process comprising:
d) generating characteristic X-ray of 40000 cps in direct beam intensity from a Cu-target X-ray tube under the conditions of 45 kV of acceleration voltage and 40 mA of filament current, to take X-ray beam out by line focus;
e) reflecting the X-ray beam generated in the d) by an X-ray mirror module, to obtain a horizontal X-ray beam of 1.2 mm in beam width, wherein the X-ray mirror module comprises a Goebel mirror and is equipped with a ½° lateral limitation slit and a vertical limitation slit of 50 μm in width, and wherein the lateral limitation slit and the vertical limitation slit is arranged at the entrance of the X-ray mirror module;
f) irradiating the X-ray beam obtained in the e) onto the main surface of the substrate arranged on a measurement stage; and
g) detecting the CuKα1 ray diffracted from the (114) plane of the aluminum nitride single crystal substrate by a two-dimensional semiconductor X-ray detector which is PIXcel 3D semiconductor detector from PANalytical B.V., to acquire an X-ray reflection topography image;
wherein measurement spots of micro-Raman spectra in the outer region are at least 3 spots arranged at 2 mm intervals along the entire length of a first part of a first line segment, wherein the first line segment connects the center of the main surface and an arc part of the periphery, wherein the first part of the first line segment is a part of the first line segment belonging to the outer region, and wherein the first line segment is randomly selected to an extent that a crack which is inherently present in the aluminum nitride single crystal substrate, a foreign matter, or deviation of crystal orientation is not on the first line segment in the outer region; and
wherein measurements of micro-Raman spectra are carried out by a third process using NRS-7100 micro-Raman spectrometer from JASCO Corporation, the third process comprising:
h) concentrating an excitation laser of 531.98 nm in wavelength and of 10.8 mW in output power such that a diameter of a measurement spot becomes 1 μm, using a slit of 10 μm in width and of 1000 μm in length, a grating of 600 lines/mm, and an objective lens of 100 times magnification;

i) irradiating the excitation laser to the main surface of the substrate, and averaging three measurement results each acquired with an exposure time of 5 seconds, to acquire a local Raman spectrum; and j) determining a peak wave number of an $E_2^{high}$ Raman shift peak in calibrating wave numbers of the local Raman spectrum obtained in the i).

2. The aluminum nitride single crystal substrate according to claim 1, wherein the ratio $(v_A-v_B)/v_B$ is within the range of ±0.05%.

3. The aluminum nitride single crystal substrate according to claim 1, wherein the ratio $(v_A-v_B)/v$ is within the range of ±0.03%.

4. The aluminum nitride single crystal substrate according to claim 1, further comprising:

an aluminum nitride single crystal layer grown by vapor phase epitaxy.

\* \* \* \* \*